United States Patent
Yuan

(10) Patent No.: US 10,913,681 B2
(45) Date of Patent: *Feb. 9, 2021

(54) GLASS-CERAMIC ARTICLE AND GLASS-CERAMIC FOR ELECTRONIC DEVICE COVER PLATE

(71) Applicant: CDGM GLASS CO., LTD., Chengdu (CN)

(72) Inventor: Baoping Yuan, Chengdu (CN)

(73) Assignee: CDGM GLASS CO., LTD., Chengdu (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/859,527

(22) Filed: Apr. 27, 2020

(65) Prior Publication Data

US 2020/0277221 A1 Sep. 3, 2020

Related U.S. Application Data

(63) Continuation of application No. 16/223,918, filed on Dec. 18, 2018, now Pat. No. 10,676,390, which is a continuation of application No. PCT/CN2018/112078, filed on Oct. 26, 2018.

(51) Int. Cl.
| | |
|---|---|
| *C03C 10/00* | (2006.01) |
| *C03C 10/04* | (2006.01) |
| *H05K 5/03* | (2006.01) |
| *C03C 3/085* | (2006.01) |

(52) U.S. Cl.
CPC .......... *C03C 10/0027* (2013.01); *C03C 3/085* (2013.01); *H05K 5/03* (2013.01); *C03C 2201/32* (2013.01); *C03C 2201/40* (2013.01); *C03C 2201/50* (2013.01); *C03C 2201/54* (2013.01); *C03C 2204/00* (2013.01)

(58) Field of Classification Search
CPC .. C03C 10/00; C03C 10/0009; C03C 10/0027
See application file for complete search history.

(56) References Cited

U.S. PATENT DOCUMENTS

| | | | | |
|---|---|---|---|---|
| 6,270,876 B1 ‡ | 8/2001 | Abe | .................... | C03C 10/0027 428/141 |
| 6,410,466 B1 ‡ | 6/2002 | Goto | .................... | C03C 10/0027 501/4 |
| 6,514,890 B1 ‡ | 2/2003 | Nagata | .................... | C03C 3/097 428/846.9 |
| 6,677,259 B2 ‡ | 1/2004 | Goto | .................... | C03C 10/0027 501/4 |
| 7,589,038 B2 ‡ | 9/2009 | Goto | .................... | C03C 10/0027 428/846.9 |
| 8,043,706 B2 ‡ | 10/2011 | Goto | ....................... | C03B 27/02 428/426 |
| 8,071,493 B2 ‡ | 12/2011 | Yagi | .................... | C03C 10/0036 428/410 |
| 8,093,167 B2 ‡ | 1/2012 | Yagi | ........................ | C03C 3/097 428/410 |
| 2002/0098964 A1 ‡ | 7/2002 | Goto | .................... | C03C 10/0027 501/4 |
| 2002/0137618 A1 ‡ | 9/2002 | Goto | .................... | C03C 10/0027 501/4 |
| 2003/0125183 A1 ‡ | 7/2003 | Nagata | .................... | C03C 3/097 501/5 |
| 2007/0082294 A1 ‡ | 4/2007 | Goto | .................... | C03C 10/0027 430/270.12 |
| 2009/0162608 A1 ‡ | 6/2009 | Yagi | ........................ | C03C 3/097 428/141 |
| 2011/0092353 A1 ‡ | 4/2011 | Amin | ...................... | C03C 3/083 501/3 |
| 2016/0102010 A1* | 4/2016 | Beall | .................... | C03C 10/0027 428/410 |

FOREIGN PATENT DOCUMENTS

| | | | |
|---|---|---|---|
| CN | 101508524 | ‡ | 8/2009 |
| JP | 2000143290 | | 5/2000 |
| JP | 2000143290 A | ‡ | 5/2000 |
| JP | 2001318222 | | 11/2001 |
| JP | 2001318222 A | ‡ | 11/2001 |

* cited by examiner
‡ imported from a related application

*Primary Examiner* — Karl E Group
(74) *Attorney, Agent, or Firm* — Hauptman Ham, LLP

(57) ABSTRACT

The present invention discloses a glass-ceramic article and a glass-ceramic for an electric device cover plate, the glass-ceramic comprises, as a predominant crystalline phase, lithium silicate and the quartz crystalline phase, and has a composition expressed in weight percent including: $SiO_2$: 65-85%, $Al_2O_3$: 1-15%, $Li_2O$: 5-15%, $ZrO_2$: 0.1-10%, $P_2O_5$: 0.1-10%, $K_2O$: 0-10%, $MgO$: 0-10%, $ZnO$: 0-10%, and $Na_2O$: 0-5%, wherein $(SiO_2+Al_2O_3+Li_2O+ZrO_2)/P_2O_5$ is 40-90, the falling ball test height is 700 mm or more. By reasonable component design, the present invention achieves excellent mechanical properties of the glass-ceramic and the glass-ceramic article of the present invention and obtains the glass-ceramic or the glass-ceramic article suitable for electronic devices at a lower cost.

30 Claims, No Drawings

GLASS-CERAMIC ARTICLE AND GLASS-CERAMIC FOR ELECTRONIC DEVICE COVER PLATE

PRIORITY CLAIM

The present application is a continuation of U.S. application Ser. No. 16/223,918, filed Dec. 18, 2018, which is a continuation of PCT/CN2018/112078, filed Oct. 26, 2018, which are incorporated herein by reference in their entireties. U.S. application Ser. No. 16/223,918 issued as U.S. Ser. No. 10/676,390B2 on Jun. 9, 2020.

FIELD OF THE INVENTION

The present invention relates to a glass-ceramic article and a glass-ceramic, in particular to a glass-ceramic article for an electronic device cover plate, a glass-ceramic, a glass cover plate for an electronic device, and an electronic device.

BACKGROUND OF THE INVENTION

Since an electronic device has various sophisticated electronic components inside, a cover plate or a casing is necessary to protect the internal electronic components. In the content disclosed in prior art, metal is the main material as cover plates. However, metal has the disadvantages of being susceptive to oxidation and shielding electromagnetic signals; some cover plates made of glass are also disclosed in prior art. For example, Chinese patent CN101508524A discloses a chemically strengthened glass, and the properties thereof such as the drop resistance and the fracture toughness are difficult to meet actual demands.

A glass-ceramic is a material that precipitates crystals inside the glass through heat-treating the glass. With the crystals dispersed inside the glass-ceramic, the glass-ceramic has physical values that cannot be obtained in the glass. For instance, the mechanical strengths such as young modulus and fracture toughness, etching characteristics against an acid or alkaline medicine solution, thermal properties such as thermal expansion coefficient, increase or disappearance of the glass transition temperature, and the like. Glass-ceramic has higher mechanical properties, and due to the crystals formed in the glass-ceramic, the glass-ceramic has obvious advantages over the ordinary glass in some properties such as bending resistance and wear resistance.

Based on the aforementioned factors, the inventors expect to develop a glass-ceramic having excellent mechanical properties and being suitable for the electronic devices through extensive experiments.

BRIEF SUMMARY OF THE INVENTION

The technical problem to be solved by the present invention is to provide a glass-ceramic article for an electronic device cover plate which has excellent mechanical properties.

The technical solutions used to solve the technical problems of the present invention are as follows:

(1) A glass-ceramic article for an electronic device cover plate comprises, as a predominant crystalline phase, lithium silicate and a quartz crystalline phase, and has a composition comprising in weight percent following components: $SiO_2$: 65-85%, $Al_2O_3$: 1-15%, $Li_2O$: 5-15%, $ZrO_2$: 0.1-10%, $P_2O_5$: 0.1-10%, $K_2O$: 0-10%, MgO: 0-10%, ZnO: 0-10%, and $Na_2O$: 0-5%, wherein $(SiO_2+Al_2O_3+Li_2O+ZrO_2)/P_2O_5$ is 40-90, the falling ball test height is 700 mm or more.

(2) The glass-ceramic article for the electronic device cover plate comprises in weight percent following components: $SiO_2$: 65-85%, $Al_2O_3$: 1-15%, $Li_2O$: 5-15%, $ZrO_2$: 0.1-10%, $P_2O_5$: 0.1-10%, $K_2O$: 0-10%, MgO: 0-10%, ZnO: 0-10%, and $Na_2O$: 0-5%.

(3) The glass-ceramic article for the electronic device cover plate according to any one of (1)-(2) further comprises, in weight percent: SrO: 0-5%, BaO: 0-5%, $TiO_2$: 0-5%, $Y_2O_3$: 0-5%, $B_2O_3$: 0-3%, and a fining agent: 0-2%.

(4) The glass-ceramic article for the electronic device cover plate according to any one of (1)-(3), wherein: $(SiO_2+Li_2O)/Al_2O_3$ is 6-15; $(Al_2O_3+Li_2O)/P_2O_5$ is 5-20; $(SiO_2+Li_2O)/P_2O_5$ is 40-80; $(K_2O+MgO)/ZrO_2$ is 0.6-1.2; or $Li_2O/(K_2O+ZrO_2)$ is 2.3-4.0.

(5) The glass-ceramic article for the electronic device cover plate according to any one of (1)-(4), wherein: $(SiO_2+Li_2O)/Al_2O_3$ is 8-13; $(Al_2O_3+Li_2O)/P_2O_5$ is 6-14; $(SiO_2+Li_2O)/P_2O_5$ is 40-70; $(SiO_2+Al_2O_3+Li_2O+ZrO_2)/P_2O_5$ is 45-85; $(K_2O+MgO)/ZrO_2$ is 0.7-1.1; and $Li_2O/(K_2O+ZrO_2)$ is 2.5-3.5.

(6) The glass-ceramic article for the electronic device cover plate according to any one of (1)-(5) comprises in weight percent following components: $SiO_2$: 70-76%, $Al_2O_3$: 4-10%, $Li_2O$: 8-12.5%, $ZrO_2$: 1-5%, $P_2O_5$: 1-3%, $K_2O$: 0-3%, MgO: 0.3-2%, ZnO: 0-3%, $Na_2O$: 0-1%, $Sb_2O_3$: 0-1%, $SnO_2$: 0-1%, SnO: 0-1%, or $CeO_2$: 0-1%.

(7) The glass-ceramic article for the electronic device cover plate according to any one of (1)-(6), wherein: $(Al_2O_3+Li_2O)/P_2O_5$ is 8.5-14; $(SiO_2+Li_2O)/P_2O_5$ is 45-60; $(SiO_2+Al_2O_3+Li_2O+ZrO_2)/P_2O_5$ is 48-80; or $(SiO_2+Li_2O)/Al_2O_3$ is 8.5-12.

(8) The glass-ceramic article for the electronic device cover plate according to any one of (1)-(7), wherein: $(K_2O+MgO)/ZrO_2$ is 0.8-1.0; or $Li_2O/(K_2O+ZrO_2)$ is 2.8-3.3.

(9) The glass-ceramic article for the electronic device cover plate according to any one of (1)-(8) comprises in weight percent: $Li_2O$ 8%-less than 10%, free of SrO, free of BaO, free of $TiO_2$, free of $Y_2O_3$, free of $GeO_2$, free of CaO, free of $Cs_2O$, free of PbO, free of $B_2O_3$, free of $As_2O_3$, free of $La_2O_3$ and free of $Tb_2O_3$.

(10) The glass-ceramic article for the electronic device cover plate according to any one of (1)-(9), wherein a crystallinity is 70% or more.

(11) The glass-ceramic article for the electronic device cover plate according to any one of (1)-(10), wherein the falling ball test height is 1000 mm or more; or a four-point bending strength is 650 MPa or more; or a haze for a thickness of 0.55 mm is 0.5% or less; or a thermal refractive index coefficient is $-0.8 \times 10^{-6}/°$ C. or less; or a light transmittance for a thickness of 0.55 mm at a wavelength of 550 nm is 88% or more.

The present invention also provides a glass-ceramic having excellent mechanical properties.

The technical solutions used to solve the technical problems of the present invention are as follows:

(12) A glass-ceramic, comprises, as a predominant crystalline phase, lithium silicate and a quartz crystalline phase, and has a composition consisting of in weight percent following components: $SiO_2$: 65-85%, $Al_2O_3$: 1-15%, $Li_2O$: 5-15%, $ZrO_2$: 0.1-10%, $P_2O_5$: 0.1-10%, $K_2O$: 0-10%, MgO: 0-10%, ZnO: 0-10%, $Na_2O$: 0-3%, $Sb_2O_3$: 0-1%, $SnO_2$: 0-1%, SnO: 0-1%, and $CeO_2$: 0-1%, wherein $(SiO_2+Al_2O_3+Li_2O+ZrO_2)/P_2O_5$ is 40-90, $(K_2O+MgO)/ZrO_2$ is 0.6-1.2, and a haze for a thickness of 0.55 mm is 0.5% or less.

(13) The glass-ceramic, comprises, as a predominant crystalline phase, lithium silicate and a quartz crystalline phase, and has a composition comprising in weight percent following components: $SiO_2$: 65-85%, $Al_2O_3$: 1-15%, $Li_2O$: 5-15%, $ZrO_2$: 0.1-10%, $P_2O_5$: 0.1-10%, $K_2O$: 0-10%, MgO: 0-10%, and ZnO: 0-10%, wherein $(SiO_2+Al_2O_3+Li_2O+ZrO_2)/P_2O_5$ is 40-90.

(14) The glass-ceramic comprises in weight percent following components: $SiO_2$: 65-85%, $Al_2O_3$: 1-15%, $Li_2O$: 5-15%, $ZrO_2$: 0.1-10%, $P_2O_5$: 0.1-10%, $K_2O$: 0-10%, MgO: 0-10%, and ZnO: 0-10%.

(15) The glass-ceramic according to any one of (12)-(14), wherein, $(SiO_2+Al_2O_3+Li_2O+ZrO_2)/P_2O_5$ is 45-85; $(SiO_2+Li_2O)/Al_2O_3$ is 8-13; $(Al_2O_3+Li_2O)/P_2O_5$ is 6-14; $(SiO_2+Li_2O)/P_2O_5$ is 40-70; or $Li_2O/(K_2O+ZrO_2)$ is 2.5-3.5.

(16) The glass-ceramic according to any one of (12)-(15), wherein $SiO_2$: 70-76%, $Al_2O_3$: 4-10%, $Li_2O$ 8-12.5%, $ZrO_2$: 1-5%, $P_2O_5$: 1-3%, $K_2O$: 0-3%, MgO: 0.3-2%, ZnO: 0-3%, and $Na_2O$: 0-1%.

(17) The glass-ceramic according to any one of (12)-(16), wherein: $(K_2O+MgO)/ZrO_2$ is 0.8-1.0; or $Li_2O/(K_2O+ZrO_2)$ is 2.8-3.3.

(18) The glass-ceramic according to any one of (12)-(17), wherein the crystallinity is 70% or more; or the grain size is 80 nm or less; or the thermal refractive index coefficient is $-0.8 \times 10^{-6}/°$ C. or less; or the average light transmittance for the thickness of 1 mm at the wavelength of 400-800 nm is 85% or more.

The present invention further provides a glass cover plate for an electronic device:

(19) The glass cover plate for the electronic device, comprises the glass-ceramic article for the electronic device cover plate according to any one of (1)-(11), or the glass-ceramic according to any one of (12)-(18).

The present invention further provides an electronic device:

(20) The electronic device comprises the glass-ceramic article for the electronic device cover plate according to any one of (1)-(11), or the glass-ceramic according to any one of (12)-(18); or the glass cover plate for the electronic device according to (19).

The present invention has a beneficial effect that the reasonable component design causes the glass-ceramic and the glass-ceramic article of the present invention to have excellent mechanical properties and be suitable for electronic devices.

EMBODIMENTS

In the following text, the glass-ceramic article for the electronic device cover plate is simply referred to as "the glass-ceramic article".

The glass-ceramic and the glass-ceramic article of the present invention are materials having the crystalline phase and the glass phase, which are different from the amorphous solids. The crystalline phases of the glass-ceramic and the glass-ceramic article can be determined by the peak angles appearing on the X-ray diffraction pattern of the X-ray diffraction analysis, and by TEMEDX, the predominant crystalline phase is measured by the X-ray diffraction.

After repeated experiments and researches, the inventors of the present invention determine the specific components constituting the glass-ceramic and the glass-ceramic article by setting the content and the content ratios to specific values, and depositing a specific crystalline phase, to obtain the glass-ceramic or the glass-ceramic article of the present invention at a lower cost.

Next, the composition range of each component of the glass composition, the glass-ceramic or the glass-ceramic article of the present invention is demonstrated. In the description, unless otherwise specified, the content of each component is all represented by weight percentage relative to the total amount of glass material of the composition in terms of oxide. Herein, "the composition in terms of oxide" means that when the oxides, the complex salts and the hydroxides and the like used as the raw materials of the components of the glass composition, the glass-ceramic or the glass-ceramic article of the present invention are decomposed during melting and converted into an oxide, the total amount of the oxide is taken as 100%. Furthermore, in the present specification, the glass only refers to the glass composition before crystallization; the glass-ceramic refers to the glass composition after crystallization; and the glass-ceramic article refers to the glass-ceramic after chemical tempering.

Unless otherwise indicated, the range of values described herein includes the upper limit value and the lower limit value, "above" and "below" includes the endpoint values, all integers and fractions within the number range, and not limited to the specific values listed in the defined ranges. The term "about" as used herein means that the formulations, parameters, or other amounts and features are not and no need to be accurate, and, if necessary, can be approximated and/or larger or lower, which reflects tolerances, scale factors and measurement errors. As used herein, the term "and/or" is inclusive, for example, "A and/or B" means only A, or only B or both A and B.

The glass, the glass-ceramic and the glass-ceramic article of the present invention can be broadly described as the lithium aluminosilicate glass, glass-ceramic and glass-ceramic article, which comprise $SiO_2$, $Al_2O_3$ and $Li_2O$ and further comprise $ZrO_2$ and $P_2O_5$ and other components. In some embodiments, depending on the composition of the glass, the first predominant crystalline phase of the glass-ceramic and the glass-ceramic article is lithium silicate; in some embodiments, the first predominant crystalline phase is petalite; in some embodiments, the first predominant crystalline phase is the quartz crystalline phase (comprising quartz or a combination of quartz and a quartz solid solution). In some embodiments, the predominant crystalline phase comprises lithium silicate and the quartz crystalline phase. In some embodiments, the predominant crystalline phase comprises lithium silicate and petalite. In some embodiments, the first crystalline phase is lithium silicate and the second crystalline phase is the quartz crystalline phase; in some embodiments, the first crystalline phase is the quartz crystalline phase and the second crystalline phase is lithium silicate; in some embodiments, the first crystalline phase is lithium silicate and the second crystalline phase is petalite; in some embodiments, the first crystalline phase is petalite and the second crystalline phase is lithium silicate. In some embodiments the predominant crystalline phase comprises lithium silicate, petalite and the quartz crystalline phase; in some embodiments, the first crystalline phase is lithium silicate; the second predominant crystalline phase is petalite; and the third predominant crystalline phase is the quartz crystalline phase; in some embodiments, the first predominant crystalline phase is lithium silicate; the second predominant crystalline phase is the quartz crystalline phase; and the third predominant crystalline phase is petalite; in some embodiments, the first crystalline phase is petalite; the second predominant crystalline phase is lithium silicate; and the third predominant phase is the quartz crystalline phase; in some embodiments, the first crystalline phase is the quartz crystalline phase; the second predominant crystalline phase is lithium silicate; and the third predominant phase is petalite. In some embodiments, the quartz crystalline phase is the α-hexagonal quartz crystalline phase; in some embodiments, the lithium silicate is lithium disilicate; there may also be β-spodumeness, lithium phosphate and the like as the minor crystalline phase. It should be noted that "the quartz crystalline phase" as used herein includes two situations, only comprising quartz crystalline, comprising quartz and the quartz solid solution.

In some embodiments, the residual glass phase in the glass-ceramic and the glass-ceramic article is 8-45% by weight; in some embodiments, is 10-40% by weight; in some embodiments, is 12-40% by weight; in some embodiments, is 15-40% by weight; in some embodiments, is 15-35% by weight; in some embodiments, is 15-32% by weight; in some embodiments, is 20-45% by weight; in some embodiments, is 20-40% by weight; in some embodiments, is 32-45% by weight; in some embodiments, is 32-40% by weight; in some embodiments, is 35-45% by weight.

When the predominant crystalline phase of the glass-ceramic is one of the quartz crystalline phase, lithium silicate, and petalite, or a combination thereof, the fracture toughness of the glass-ceramic becomes higher. When the predominant crystalline phase of the glass-ceramic is the quartz crystalline phase and lithium disilicate, refractive index temperature coefficient of the glass-ceramic becomes lower, and fracture toughness becomes higher; the falling ball test height for glass-ceramic becomes larger, the four-point bending strength becomes larger.

In the present invention, the predominant crystalline phase accounts for 50-92% by weight of the glass-ceramic or the glass-ceramic article; in some embodiments, the weight percentage reaches 60~90%; in some embodiments, the weight percentage reaches 65~85%; in some embodiments, the weight percentage reaches 70~80%; in some embodiments, the weight percentage reaches 80~92%. "The predominant crystalline phase" as used herein refers to a crystalline phase having higher weight percentage than other crystalline phases present in the glass-ceramic or the glass-ceramic article.

In some embodiments, the weight percentage of the quartz crystalline phase of the glass-ceramic or the glass-ceramic article is 70% or less; in some embodiments, the weight percentage of the quartz crystalline phase of the glass-ceramic or the glass-ceramic article is 65% or less; in some embodiments, the weight percentage of the quartz crystalline phase of the glass-ceramic or the glass-ceramic article is 60% or less; in some embodiments, the weight percentage of the quartz crystalline phase of the glass-ceramic or the glass-ceramic article is 55% or less; in some embodiments, the weight percentage of the quartz crystalline phase of the glass-ceramic or the glass-ceramic article is 50% or less; in some embodiments, the weight percentage of the quartz crystalline phase of the glass-ceramic or the glass-ceramic article is 45% or less.

In some embodiments, the weight percentage of the lithium silicate crystalline phase of the glass-ceramic or the glass-ceramic article is 55% or less; in some embodiments, the weight percentage of the lithium silicate crystalline phase of the glass-ceramic or the glass-ceramic article is 50% or less; in some embodiments, the weight percentage of the lithium silicate crystalline phase of the glass-ceramic or the glass-ceramic article is 45% or less; in some embodiments, the weight percentage of the lithium silicate crystalline phase of the glass-ceramic or the glass-ceramic article is 40% or less.

In some embodiments, the weight percentage of the petalite crystalline phase of the glass-ceramic or the glass-ceramic article is 40% or less; in some embodiments, the weight percentage of the petalite crystalline phase of the glass-ceramic or the glass-ceramic article is 35% or less; in some embodiments, the weight percentage of the petalite crystalline phase of the glass-ceramic or the glass-ceramic article is 30% or less; in some embodiments, the weight percentage of the petalite crystalline phase of the glass-ceramic or the glass-ceramic article is 25% or less; in some embodiments, the weight percentage of the petalite crystalline phase of the glass-ceramic or the glass-ceramic article is 20% or less; in some embodiments, the weight percentage of the petalite crystalline phase of the glass-ceramic or the glass-ceramic article is 15% or less.

$SiO_2$ is a basic component of the glass composition of the present invention and can be used to stabilize the mesh structure of the glass and the glass-ceramic, $SiO_2$ is one of the components forming lithium silicate, the quartz crystalline phase and petalite after crystallization, if the content of $SiO_2$ is 65% or less, the crystals formed in the glass-ceramic becomes less and tend to be coarser, affecting the haze of the glass-ceramic and the glass-ceramic article, and the performance of the falling ball test height for glass-ceramic article. Therefore, the lower limit of the content of $SiO_2$ is preferably 65%, preferably 70%. If the content of $SiO_2$ is 85% or more, the melting temperature of the glass is high, resulting in a difficult melting of the material and an uneasy molding of the glass, which affects the uniformity of the glass. Therefore the upper limit of the content of $SiO_2$ is preferably 85%, preferably 80%, and more preferably 76%. In some embodiments, it can comprise about 66%, 67%, 68%, 69%, 70%, 71%, 72%, 73%, 74%, 75%, 76%, 77%, 78%, 79%, 80%, 81%, 82%, 83% and 84% $SiO_2$.

$Al_2O_3$ is a component for forming the mesh structure of the glass. $Al_2O_3$ is an important component assisting in stabilizing the molding of the glass and improving the chemical stability. $Al_2O_3$ can also improve the mechanical properties of the glass and increase the depth of the ion exchange layer and the surface stress of the glass-ceramic article. However, if the content of $Al_2O_3$ is less than 1%, the effects mentioned above are poor. Thus the lower limit of the content of $Al_2O_3$ is 1%, and preferably 4%. Alternatively, if the content of $Al_2O_3$ exceeds 15%, the meltability and the devitrification resistance of the glass decrease, and the crystals tend to be larger during crystallization, decreasing the strength of the glass-ceramic and the glass-ceramic article. Thus the upper limit of the content of $Al_2O_3$ is 15%, preferably 12%, and more preferably 10%. In some embodiments, it can comprise about 1%, 2%, 3%, 4%, 5%, 6%, 7%, 8%, 9%, 10%, 11%, 12%, 13%, 14% and 15% $Al_2O_3$.

$Li_2O$ is an essential component of the crystalline phase composition after crystallization. $Li_2O$ contributes to the formation of lithium-containing crystalline phase such as lithium silicate and petalite and is essential for the chemical strengthening. But if the content of $Li_2O$ is less than 5%, the effects are poor. Therefore, the lower limit of the content of $Li_2O$ is 5%, preferably 7%, and more preferably 8%. In some embodiments, more preferably 9%; on the other hand, if $Li_2O$ is excessively contained, it is easy to lower the chemical stability of the glass and deteriorate the light transmittance of the glass-ceramic and the glass-ceramic article. Hence the upper limit of the content of $Li_2O$ is preferably 15%, and more preferably 12.5%, in some embodiments, further preferably less than 10%. In some embodiments, it can comprise about 5%, 6%, 7%, 8%, 9%, 9.8%, 10%, 11%, 12%, 13%, 14% and 15% $Li_2O$.

The inventors found, in intensive experiments and studies, that the thermal expansion coefficient of the glass and the haze and the grain size of the glass-ceramic and the glass-ceramic article can be affected by controlling the introduction of $SiO_2$, $Li_2O$ and $Al_2O_3$ in a certain ratio. In particular, $(SiO_2+Li_2O)/Al_2O_3$ falling within a range from 6 to 15 causes the glass to have a lower thermal expansion coefficient and obtain smaller grain size after crystallization, and improves the mechanical strength of the glass-ceramic and glass-ceramic article. In some embodiments, $(SiO_2+Li_2O)/Al_2O_3$ is preferably 8-13, more preferably 8-12.5, which can further obtain a lower haze, allowing the glass-ceramic and the glass-ceramic article to have an excellent light transmittance. Furthermore, $(SiO_2+Li_2O)/Al_2O_3$ is preferably 8.5-12 to have a remarkable effect. In some embodiments, the value of $(SiO_2+Li_2O)/Al_2O_3$ can be 6, 6.5, 7, 7.5, 8, 8.5, 9, 9.5, 10, 10.5, 11, 11.5, 12, 12.5, 13, 13.5, 14, 14.5 and 15.

$P_2O_5$ is an optional component that assists in improving the low-temperature melting property of the glass and is able to form the crystal nucleus in the glass through phase separation, and improve the thermal expansion stability of the glass during crystallization. The lower limit of the content of $P_2O_5$ is preferably 0.1, more preferably 0.5%, and further preferably 1%. However, if $P_2O_5$ is excessively contained, it is easy to cause to the glass have reduced devitrification resistance, and phase separation of the glass, the mechanical properties of the glass tend to deteriorate. Therefore, the upper limit of the content of $P_2O_5$ is 10%, preferably 5%, and more preferably 3%. In some embodiments, it can comprise about 0%, 0.1%, 0.3%, 0.5%, 1%, 2%, 3%, 4%, 5%, 6%, 7%, 8%, 9% and 10% $P_2O_5$.

In the present invention, by controlling the value of $(SiO_2+Li_2O)/P_2O_5$ in the range of 40-80, the depth of the ion exchange layer of the glass-ceramic article can be optimized. In particular, the value of $(SiO_2+Li_2O)/P_2O_5$ is in the range of 40-70, more preferably the value of $(SiO_2+Li_2O)/P_2O_5$ is from 42 to 60, and further preferably from 45 to 60, the glass-ceramic article can obtain a deeper ion exchange layer. In some embodiments, when the value of $(SiO_2+Li_2O)/P_2O_5$ is in a range of 40-70, more preferably in a range of 42-60, and further preferably in a range of 45-60, the crystallization process facilitates the formation of the quartz crystalline phase and lithium disilicate, and the glass-ceramic and the glass-ceramic article have excellent refractive index temperature coefficient, so as to be $-0.5 \times 10^{-6}/°C$. or less, preferably $-0.8 \times 10^{-6}/°C$. or less, and more preferably $-1.1 \times 10^{-6}/°C$. or less, which reduces the differences in refractive index caused by the temperature difference between the glass phase and the other crystalline phase of the glass-ceramic and the glass-ceramic article, and prevent the light transmittance of the glass-ceramic or the glass-ceramic article from decreasing due to the change of the temperature difference. In some embodiments, the value of $(SiO_2+Li_2O)/P_2O_5$ can be 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70.

Through extensive experiments and studies, the inventors found that the ratio of $Al_2O_3$, $Li_2O$ and $P_2O_5$ that introduced into the glass has a significant effect on the surface stress and the four-point bending strength of the glass-ceramic and the glass-ceramic article. In particular, when $(Al_2O_3+Li_2O)/P_2O_5$ is in a range of 5-20, it can improve the surface stress of the glass-ceramic and the glass-ceramic article. Preferably, $(Al_2O_3+(Li_2O)/P_2O_5$ is in a range of 6-14, in some embodiments, more preferably in a range of 8-14, and further preferably in a range of 8.5-14, it is easy to form the quartz crystalline phase and lithium disilicate and obviously improve the four-point bending strength of the glass-ceramic and the glass-ceramic article. In some embodiments, the four-point bending strength of the glass-ceramic and the glass-ceramic article is 600 MPa or more, preferably 650 MPa or more, and more preferably 700 MPa or more. In some embodiments, the value of $(Al_2O_3+Li_2O)/P_2O_5$ can be 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20.

$ZrO_2$ is capable of precipitating the crystal to form the crystal nucleus and is an optional component helping to improve the chemical stability of the glass. According to studies, it is found that $ZrO_2$ can further improve the stability of the $Li_2O$—$Al_2O_3$—$SiO_2$—$P_2O_5$ glass by significantly reducing the glass devitrification and lowering the liquidus temperature during the formation process. In the present invention, the lower limit of the content of $ZrO_2$ is preferably 0.1, more preferably 0.5%, and further preferably 1%. However, if $ZrO_2$ is excessively contained, the devitrification resistance of the glass decreases easily and the difficulty of controlling the glass crystallization process increases. Consequently, the upper limit of the content of $ZrO_2$ is 10%, preferably 6%, and more preferably 5%. In some embodiments, the content of $ZrO_2$ can be about 0%, 0.1%, 0.3%, 0.5%, 1%, 2%, 3%, 4%, 5%, 6%, 7%, 8%, 9% and 10%.

In a large number of experimental studies, the inventors found that by controlling the ratio of the total content of $SiO_2$, $Al_2O_3$, $Li_2O$ and $ZrO_2$ to the introduced content of $P_2O_5$, namely $(SiO_2+Al_2O_3—(Li_2O+ZrO_2)/P_2O_5$, in the range of 40-90, the glass-ceramic article can be subjected to a falling-ball impact of 700 mm or more, preferably $(SiO_2+Al_2O_3+Li_2O+ZrO_2)/P_2O_5$ is from 45 to 85. Particularly, in some embodiments, if $(SiO_2+Al_2O_3+Li_2O+ZrO_2)/P_2O_5$ is in a range of 48-80, the lithium disilicate and the quartz crystalline phase forms easily, and the glass-ceramic article is relatively easy to obtain an excellent fracture toughness. The fracture toughness can be 1 $MPa·m^{1/2}$ or more, preferably 1.3 $MPa·m^{1/2}$ or more, and more preferably 1.5 $MPa·m^{1/2}$ or more. At the same time, in order to further optimize the tolerance of the falling ball test height, $(SiO_2+Al_2O_3+Li_2O+ZrO_2)/P_2O_5$ is further preferably from 48 to 80. The falling ball test height is 700 mm or more, preferably 800 mm or more, more preferably 1000 mm or more, and further preferably 1200 mm or more. In some embodiments, $(SiO_2+Al_2O_3+Li_2O+ZrO_2)/P_2O_5$ can be 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90.

$K_2O$ is an optional component helping to improve the low-temperature melting property and the formability of the glass. However, if $K_2O$ is excessively contained, it is easy to cause a decrease in the chemical stability of the glass and an increase in the average linear expansion coefficient. Hence, the content of $K_2O$ is from 0% to 10%, preferably from 0% to 5%, and more preferably from 0% to 3%. In some embodiments, it can comprise about 0%, more than 0%, 0.1%, 0.3%, 0.5%, 1%, 2%, 3%, 4%, 5%, 6%, 7%, 8%, 9% and 10% $K_2O$.

In the present invention, when the introduced ratio of $Li_2O$ to the total content of $K_2O$ and $ZrO_2$, namely $Li_2O/(K_2O+ZrO_2)$, is controlled in a range of 2.3-4.0, the crystalline property of the glass-ceramic can be optimized, causing the glass-ceramic and the glass-ceramic article to have a suitable amount of the crystallinity, so that the glass-ceramic and the glass-ceramic article have an excellent properties. Preferably, $Li_2O/(K_2O+ZrO_2)$ is from 2.5 to 3.5, and more preferably from 2.8 to 3.3, which increase the falling ball test height for the glass-ceramic and the glass-ceramic article. In some embodiments, the falling ball test height is preferably 800 mm or more, more preferably 1000 mm or more, and further preferably 1200 mm or more. In some embodiments, the value of $Li_2O/(K_2O+ZrO_2)$ can be 2.3, 2.4, 2.5, 2.6, 2.7, 2.8, 2.9, 3.0, 3.1, 3.2, 3.3, 3.4, 3.5, 3.6, 3.7, 3.8, 3.9 and 4.0.

ZnO is capable of improving the melting properties of the glass, improving the chemical stability of the glass, and refining the grain during crystallization. The decrease in the devitrification can be suppressed by controlling the upper limit of the content of ZnO to 10% or less. Therefore, the upper limit of the content of ZnO is 10%, preferably 5%, and more preferably 3%. In some embodiments, it can comprise about 0%, more than 0%, 0.1%, 0.5%, 1%, 2%, 3%, 4%, 5%, 6%, 7%, 8%, 9% and 10% ZnO.

MgO assists in reducing the viscosity of the glass, inhibiting crystallization of the glass during formation and refining the grain during crystallization, and have the effect of improving low-temperature melting property. In the present invention, MgO is an optional component, and a preferred content thereof is 0.3% or more. But if MgO is an excessively contained, it may cause a decrease in the devitrification resistance and obtain an undesired crystal after crystallization, resulting in a decrease in the properties of the glass-ceramic and the glass-ceramic article. Therefore, the upper limit of the content of MgO is 10%, preferably 5%, and more preferably 2%. In some embodiments, it can comprise about 0%, more than 0%, 0.5%, 1%, 2%, 3%, 4%, 5%, 6%, 7%, 8%, 9% and 10% MgO.

With intensive experiments and studies, the inventors found that when the ratio of the total content of $K_2O$ and MgO, i.e. $K_2O+MgO$, to the introduced content of $ZrO_2$, that is $(K_2O+MgO)/ZrO_2$, is controlled in a range of 0.6-1.2, a synergistic effect with $Li_2O$ is produced, causing the glass-ceramic and the glass-ceramic article to have suitable amount of the crystallinity. As a result, the glass-ceramic and the glass-ceramic article have excellent properties. Meanwhile, the studies found that by preferably controlling $(K_2O+MgO)/ZrO_2$ in a range of 0.7-1.1, the crystal grain can be refined and cause the light transmittance and the mechanical property to be more excellent, more preferably $(K_2O+MgO)/ZrO_2$ is from 0.8 to 1.0, in some embodiments, the four-point bending strength of the glass-ceramic and the glass-ceramic article increases, the four-point bending strength is preferably 650 MPa or more, and more preferably 700 MPa or more. In some embodiments, $(K_2O+MgO)/ZrO_2$ can be 0.6, 0.65, 0.7, 0.75, 0.8, 0.85, 0.9, 0.95, 1.0, 1.05, 1.1, 1.15 and 1.2.

SrO is an optional component that improves the low-temperature melting property of the glass and inhibits the formation of the crystallization. In the present invention, SrO is preferably controlled to 5% or less, enabling the glass-ceramic and the glass-ceramic article to easily obtain the excellent grain size. Preferably, the content of SrO is 1% or less. In some embodiments, SrO is preferably not introduced. In some embodiments, it comprises about 0%, more than 0%, 0.3%, 0.5%, 1%, 2%, 3%, 4% and 5% SrO.

BaO is an optional component assisting in improving the glass formation ability of the glass. When the content of BaO exceeds 5%, the devitrification resistance of the glass reduces. Therefore, in the present invention, the content of BaO is preferably controlled to 5% or less, and more preferably 1% or less. In some embodiments, BaO is preferably not introduced. In some embodiments, it comprises about 0%, more than 0%, 0.3%, 0.5%, 1%, 2%, 3%, 4% and 5% BaO.

$TiO_2$ is an optional component contributing to decrease the melting temperature of the glass and improve the chemical stability. In the present invention, the introduction of 5% or less can make the glass crystallization process easy to control. Preferably the content of $TiO_2$ is 1% or less. In some embodiments, $TiO_2$ is preferably not introduced. In some embodiments, $TiO_2$ can be about 0%, more than 0%, 0.3%, 0.5%, 1%, 2%, 3%, 4% and 5%.

$Y_2O_3$ is an optional component contributing to improve the hardness and chemical stability of the glass. But if the content of $Y_2O_3$ is excessive, it is easy to cause crystallization of the glass. The content of $Y_2O_3$ is 5% or less, preferably 1% or less. In some embodiments, $Y_2O_3$ is preferably not introduced. In some embodiments, $Y_2O_3$ can be about 0%, more than 0%, 0.3%, 0.5%, 1%, 2%, 3%, 4% and 5%.

$Na_2O$ is an optional component for improving the meltability of the glass, if the content is high, it tends to cause an increase of the crystalline phase precipitated or a change of precipitating crystalline phase during crystallization. Thus, without damaging the properties of the glass-ceramic and the glass-ceramic article of the present invention, the glass-ceramic article can preferably comprise $Na_2O$ of 5% or less, more preferably 3% or less, and further preferably 1% or less. In some embodiments, preferably free of $Na_2O$. In some embodiments, it comprises about 0%, more than 0%, 0.1%, 0.2%, 0.3%, 0.4%, 0.5%, 0.6%, 0.7%, 0.8%, 0.9%, 1.0%, 1.1%, 1.2%, 1.3%, 1.4%, 1.5%, 1.6%, 1.7%, 1.8%, 1.9%, 2.0%, 2.1%, 2.2%, 2.3%, 2.4%, 2.5%, 2.6%, 2.7%, 2.8%, 2.9%, 3.0%, 3.1%, 3.2%, 3.3%, 3.4%, 3.5%, 3.6%, 3.7%, 3.8%, 3.9%, 4.0%, 4.1%, 4.2%, 4.3%, 4.4%, 4.5%, 4.6%, 4.7%, 4.8%, 4.9% and 5.0% $Na_2O$.

$B_2O_3$ helps to provide the glass having a low melting temperature. When the content of $B_2O_3$ is high, the chemical stability of the glass reduces. Therefore the content of $B_2O_3$ is 3% or less. In some embodiments, preferably from 0.1% to 2%. In some embodiments, $B_2O_3$ is preferably not introduced. In some embodiments, it comprises about 0%, more than 0%, 0.1%, 0.2%, 0.3%, 0.4%, 0.5%, 0.6%, 0.7%, 0.8%, 0.9%, 1.0%, 1.1%, 1.2%, 1.3%, 1.4%, 1.5%, 1.6%, 1.7%, 1.8%, 1.9%, 2.0%, 2.1%, 2.2%, 2.3%, 2.4%, 2.5%, 2.6%, 2.7%, 2.8%, 2.9% and 3.0% $B_2O_3$.

One or more components of $Sb_2O_3$, $SnO_2$, SnO and $CeO_2$ are introduced as the fining agent, wherein the upper limit of the content of $Sb_2O_3$ is 2%, preferably 1%, and more preferably 0.5%. The upper limit of the content of each of $SnO_2$, SnO or $CeO_2$ is respectively 2%, preferably 1%, and more preferably 0.5%. In some embodiments, the content of one or more of the above four fining agents is about 0%, more than 0%, 0.1%, 0.2%, 0.3%, 0.4%, 0.5%, 0.6%, 0.7%, 0.8%, 0.9%, 1.0%, 1.1%, 1.2%, 1.3%, 1.4%, 1.5%, 1.6%, 1.7%, 1.8%, 1.9% and 2.0%.

In some embodiments, $As_2O_3$, a compound of Cl, a compound of Br, or the like may be used as a fining agent, the content thereof is 2% or less, preferably 1% or less, and more preferably 0.5% or less.

In the present invention, in order to obtain the appropriate grain size and the type of the crystalline phase, it is preferred in some embodiments not to introduce components such as $La_2O_3$, $Cs_2O$, $Tb_2O_3$, $GeO_2$ and CaO; PbO and $As_2O_3$ are toxic substances, even if a small amount is added, it could not meet the environmental requirements. Therefore, in some embodiments of the present invention does not comprise PbO and $As_2O_3$.

As used herein, "not introduced", "not comprise", "not contained", "is free of" and "0%" mean that the compounds, molecules or elements are not intentionally added as the raw materials into the glass, the glass-ceramic or the glass ceramic article of the present invention. However, since the raw materials and/or the apparatuses used to produce the glass, the glass-ceramic and the glass-ceramic article may have some impurities or components that are not intentionally added, it will be contained in small or trace amounts in the final glass composition, glass-ceramic and the glass-ceramic article and such situation is also within the scope of the present invention.

In some embodiments of the present invention, the predominant crystalline phase of the glass-ceramic and the glass-ceramic article comprises lithium silicate and the quartz crystalline phase, wherein the lithium silicate includes lithium disilicate ($Li_2Si_2O_5$) and lithium metasilicate ($Li_2SiO_3$), in some embodiments, lithium disilicate, and the quartz crystalline phase and/or petalite are preferably used as the predominant crystalline phase, in some embodiments, lithium disilicate and the quartz crystalline phase are preferably used as the predominant crystalline phase, in some preferred embodiments, the lithium disilicate and α-quartz crystalline phase are used as the predominant crystalline phase, resulting in more excellent properties of the present invention.

The glass-ceramic of the present invention is provided with an excellent mechanical property and able to obtain additional mechanical strength by performing the ion exchange. According to the reasonable component design, the glass-ceramic and the glass-ceramic article of the present invention obtain the suitable grain size. Meanwhile, the glass-ceramic and the glass-ceramic article of the present invention have a good crystallinity, causing the glass-ceramic and the glass-ceramic article of the present invention to have an excellent mechanical property. The "crystallinity" as used herein refers to the degree of completeness of crystallization, crystal with complete crystallization has a relatively regular arrangement of the internal particles, diffraction line is strong, sharp and symmetrical, the full width at half maximum of the diffraction peak is close to the width measured by the instrument, the crystal having a low crystallinity has defects such as dislocation, which make the diffraction line peak shape wide and diffuse. The worse the crystallinity, the weaker the diffraction ability, and the wider the diffraction peak, until it disappears into the background.

The grain size and the haze of the glass-ceramic or the glass-ceramic article of the present invention may affect the transparency, i.e. the light transmittance, of the glass-ceramic and or the glass-ceramic article. The smaller the grain is, the higher the transparency is. The smaller the haze is, the higher the transparency is. In some embodiments, the haze for a thickness of 0.55 mm is 0.6% or less, preferably 0.5% or less, and more preferably 0.4% or less. In some embodiments, the grain size is 100 nm or less, preferably 80 nm or less, more preferably 60 nm or less, further preferably 50 nm or less, and still more preferably 40 nm or less. On the other hand, according to the studies, it is found that the smaller the difference of the refractive index between the crystalline phase and the glass phase of the glass-ceramic, the higher the transparency of the glass-ceramic or the glass-ceramic article.

In some embodiments, the glass-ceramic or the glass-ceramic article has a high transparency in the visible range (namely, the glass-ceramic or the glass-ceramic article is transparent). In some embodiments, the average light transmittance for a thickness of 1 mm at a wavelength in a range of 400-800 nm is 80% or more, preferably 85% or more, and more preferably 88% or more. In some preferred embodiments, the light transmittance for a thickness of 0.55 mm at a wavelength of 550 nm is 80% or more, preferably 85% or more, more preferably 88% or more, and further preferably 91% or more.

In some embodiments, the antimicrobial components may be added to the glass, the glass-ceramic or the glass-ceramic article.

The glass composition, the glass-ceramic and the glass-ceramic of the present invention can be produced and manufactured with the following method:

Producing the glass composition: uniformly mixing the raw materials in accordance with the composition ratio range, placing the uniform mixture into a crucible made of platinum or quartz, according to the melting difficulty of the glass composition, melting in an electric furnace or a gas furnace at a temperature range of 1250-1650° C. for 5-24 hours, stirring it to uniform, cooling to a suitable temperature and casting into a mold, and gradually cooling to form the glass composition.

The glass composition of the present invention can be molded with any methods known in the art. In some embodiments, the refractive index (nd) of the glass composition of the present invention is 1.500-1.530, and preferably 1.510-1.525.

After molding or molding process, the glass composition of the present invention is subjected to the crystallization treatment through the crystallization process, so as to uniformly precipitate crystal inside the glass. Such crystallization treatment may be carried out in one stage or two stages. Preferably, the crystallization treatment is carried out in two stages. The nucleating process is performed at a first temperature, then the crystal growth process is performed at a second temperature higher than the temperature of the nucleating process. The crystallization treatment carried out at the first temperature is referred to as the first crystallization treatment. The crystallization treatment carried out at the second temperature is referred to as the second crystallization treatment.

In order to obtain desired physical properties of the glass-ceramic, the preferred crystallization process is as follows:

The above crystallization treatment is performed in one stage, and the nucleating process and the crystal growth process can be continuously performed. That is, the temperature is raised to the predetermined temperature of the crystallization treatment, after the heat treatment temperature is reached, the temperature is maintained for a certain period of time and then the temperature is lowered. The temperature of such crystallization treatment is preferably 490-800° C., and more preferably 550-750° C. to precipitate the desired crystallization phase. The holding time at the temperature of the crystallization treatment is preferably 0-8 hours, and more preferably 1-6 hours.

When the above crystallization treatment is performed in two stages, the first temperature is preferably 490-650° C. and the second temperature is 600-850° C. The holding time at the first temperature is preferably 0-24 hours, more preferably 2-15 hours. The holing time at the second temperature is preferably 0-10 hours, more preferably 0.5-6 hours.

The holding time of 0 hour as described above means that the temperature is lowered or increased in less than one minute after reaching the temperature.

In some embodiments, the refractive index (nd) of the glass-ceramic obtained through the crystallization treatment of the present invention is from 1.520 to 1.550, preferably from 1.530 to 1.545.

In some embodiments, the glass composition or the glass-ceramic of the present invention can be manufactured to the shaped body by various processes, the shaped body includes but not limits to sheet. The processes include but not limit to slit drawing, floating, rolling and other sheet forming processes known in the art. Alternatively, the glass composition or the glass-ceramic can be manufactured by the floating process or the rolling process known in the art.

The glass composition or the glass-ceramic of the present invention may be manufactured to the glass shaped body of sheet by grinding or polishing process. However, the manufacturing methods of the glass shaped body are not limited to the aforementioned methods.

The glass or the glass-ceramic shaped body of the present invention can be manufactured into various shapes by processes such as hot bending or compression at a certain temperature, and are not limited to the abovementioned processes.

The glass composition, the glass-ceramic and the glass-ceramic article of the present invention can have any reasonable and useful thickness.

In addition to improving mechanical properties by precipitating crystallization, the glass ceramic of the present invention can also obtain higher strength by forming a compressive stress layer, thereby producing a glass-ceramic product.

In some embodiments, the glass composition or the glass-ceramic may be processed to sheet and/or shaped (e.g. punching, hot bending, etc.), polished and/or side polished after molding, then carried out chemical tempering by chemical tempering process.

The "chemical tempering" as used herein is the ion exchange method. The glass and the glass-ceramic of the present invention can be ion exchanged by the methods known in the art. During the ion exchange process, the smaller metal ions in the glass or the glass-ceramic are replaced or "exchanged" by the larger metal ions of the same valence state near the glass or the glass-ceramic. The smaller ions are replaced by the larger ions, and the compressive stress is built up in the glass or the glass-ceramic to form a compressive stress layer.

In some embodiments, the metal ions are the monovalent alkali metal ions (e.g. $Na^+$, $K^+$, $Rb^+$, $Cs^+$, etc.), ion exchange is carried out by immersing the glass or the glass-ceramic in a salt bath comprising at least one of the molten salts of the larger metal ion, the larger metal ion is used to replace the smaller metal ion in the glass. Alternatively, other monovalent metal ions, such as $Ag^+$, $Tl^+$, $Cu^+$ etc., can also be used to exchange the monovalent ion. One or more ion exchange processes used to chemically temper the glass or the glass-ceramic may include, but are not limited to: immersing the glass or the glass-ceramic in a single salt bath or in multiple baths having the same or the different composition, wherein the washing and/or annealing step is disposed between immersions.

In some embodiments, ion exchange may be carried out by immersing the glass or the glass-ceramic in the salt bath of the molten sodium salt (e.g. $NaNO_3$) at a temperature of about 430-470° C. for about 6-20 hours. The preferred temperature range is from 435° C. to 460° C., the preferred time range is 8-13 hours. In such embodiment, the Na ions replace a portion of the Li ions in the glass or the glass-ceramic to form the surface compression layers and exhibit high mechanical properties. In some embodiments, ion exchange may be carried out by immersing the glass or the glass-ceramic in the salt bath of the molten K salt (e.g. $KNO_3$) at a temperature of about 400-450° C. for about 1-8 hours, wherein the preferred time range is 2-4 hours.

In some preferred embodiments, the ion exchange layer has a depth of 80 μm or more, preferably 85 μm or more, by a salt bath of molten Na salt (e.g. $NaNO_3$) at 450° C. for about 8 hours.

In some embodiments, there is also the ion implantation method of implanting ions into the surface layer of the glass or the glass-ceramic, and the thermal tempering method of heating the glass and the glass-ceramic and then cooling down rapidly.

The performance indexes of the glass composition, the glass-ceramic and/or the glass-ceramic article of the present invention are tested with the following methods:

[Thermal Expansion Coefficient]

The thermal expansion coefficient ($\alpha_{20° C.-120° C.}$) is tested according to GB/T7962.16-2010 test methods.

[Refractive Index]

The refractive index (nd) is tested according to GB/T7962.1-2010 methods.

[Haze]

The haze tester EEL57D is used to prepare a glass sample having a thickness of 0.55 mm, and test according to GB2410-80.

[Grain Size]

The grain size is tested with SEM. The surface of the glass-ceramic is treated in HF acid, then the surface of the glass-ceramic is sprayed with gold, and the surface is scanned by SEM scanning electron microscopy to determine the grain size.

[Light Transmittance]

The sample is processed to a thickness of 1 mm and subjected to parallel polishing on opposed surfaces thereof, and an average light transmittance of 400-800 nm is measured by Hitachi U-41000 spectrophotometer.

The sample is processed to a thickness of 0.55 mm and subjected to parallel polishing on opposed surfaces thereof, and an average light transmittance of 550 nm is measured by Hitachi U-41000 spectrophotometer.

[Thermal Refractive Index Coefficient]

The thermal refractive index coefficient is tested according to the methods specified in GB/T 7962.4-2010, and tested thermal refractive index coefficient at 20-40° C.

[Crystallinity]

XRD diffraction peaks are compared with the pattern database. The crystallinity is obtained by calculating the ratio of the diffraction intensity of the crystalline phase to the overall pattern intensity, and internally demarcated by the pure quartz crystal.

[Surface Stress] and [Depth of Ion Exchange Layer]

The surface stress is tested by the glass surface stress instrument FSM-6000LEUV.

The depth of ion exchange layer is tested by the glass surface stress instrument SLP-2000.

The measurement conditions are calculated with the refractive index of 1.54 and the optical elastic constant of 25.3 [(nm/cm)/MPa].

[Falling Ball Test Height]

Two surfaces of a sample of 150×57×0.55 mm is polished, and placed on a rubber sheet, a steel ball of 132 g is dropped from a predetermined height, that the maximum the falling ball test height at which the sample is not broken and can withstand an impact. Particularly, the test is carried out from a height of 650 mm, without breaking, the height is successively increased to 700 mm, 750 mm, 800 mm, 850 mm, 900 mm or more. For the embodiments having "the falling ball test height" the glass-ceramic article is used as the test object. In the examples, the test data of 900 mm recorded indicates that even if the steel ball is dropped from a height of 900 mm, the glass-ceramic article can withstand the impact without breaking.

[Fracture Toughness]

Using the method of directly measuring the size of the indentation expansion crack, the sample size is 2 mm×4 mm×20 mm, after chamfering, smoothing and polishing, after the sample preparation is completed, a Vickers hardness indenter is used to apply a force of 49 N to the sample for a period of 30 s. After the indentation was applied, the fracture strength is measured by three-point bending method.

[Four-Point Bending Strength]

The microcomputer controlled electronic universal CMT6502 is used, and the glass size is 150×57×0.55 mm, test in accordance with ASTM C 158-2002.

The glass composition of the present invention has the following properties:

1) In some embodiments, the thermal expansion coefficient ($\alpha_{20° C.-120° C.}$) is $45\times10^{-7}$/K~$70\times10^{-7}$/K, preferably $50\times10^{-7}$/K~$70\times10^{-7}$/K.

2) In some embodiments, the refractive index (nd) is from 1.500 to 1.530, preferably from 1.510 to 1.525.

The glass-ceramic of the present invention has the following properties:

1) In some embodiments, the haze for a thickness of 0.55 mm is 0.6 or less, preferably 0.5% or less, and more preferably 0.4% or less.

2) In some embodiments, the grain size is 100 nm or less, preferably 80 nm or less, more preferably 60 nm or less, further preferably 50 nm or less, and still further preferably 40 nm or less.

3) In some embodiments, the thermal refractive index coefficient of the glass-ceramic of the present invention is $-0.5\times10^{-6}$/° C. or less, preferably $-0.8\times10^{-6}$/° C. or less, and more preferably $-1.1\times10^{-6}$/° C. or less.

4) In some embodiments, the crystallinity is 50% or more, preferably 65% or more, more preferably 70% or more, and further preferably 75% or more.

5) In some embodiments, the refractive index (nd) is from 1.520 to 1.550, preferably from 1.530 to 1.545.

6) In some embodiments, the average light transmittance for a thickness of 1 mm at a wavelength in a range of 400-800 mm is 80% or more, preferably 85% or more, and more preferably 88% or more.

7) In some embodiments, the light transmittance for a thickness of 0.55 mm at a wavelength of 550 nm is 80% or more, preferably 85% or more, more preferably 88% or more, and further preferably 91% or more.

In addition to the aforementioned properties of the glass-ceramic, the glass-ceramic article of the present invention further has the following properties:

1) In some embodiments, the surface stress is 200 MPa or more, preferably 250 MPa or more, and more preferably 300 MPa or more;

2) In some embodiments, the four-point bending strength is 600 MPa or more, preferably 650 MPa or more, and more preferably 700 MPa or more;

3) In some embodiments, the depth of the ion exchange layer is 30 μm or more, preferably 50 μm or more, more preferably 60 μm or more, further preferably 80 μm or more;

4) In some embodiments, the falling ball test height is 700 mm or more, preferably 800 mm or more, more preferably 1000 mm or more, and further preferably 1200 mm or more;

5) In some embodiments, fracture toughness is 1 MPa·m$^{1/2}$ or more, preferably 1.3 MPa·m$^{1/2}$, and more preferably 1.5 MPa·m$^{1/2}$.

6) In some embodiments, the average light transmittance for a thickness of 1 mm at a wavelength in a range of 400-800 mm is 80% or more, preferably 85% or more, and more preferably 88% or more.

7) In some embodiments, the light transmittance for a thickness of 0.55 mm at a wavelength of 550 nm is 80% or more, preferably 85% or more, more preferably 88% or more, and further preferably 91% or more.

Due to the aforementioned excellent properties, the glass-ceramic and the glass-ceramic article of the present invention can be widely manufactured to the glass cover plate or the glass components; meanwhile, the glass-ceramic, the glass-ceramic article as well as the glass cover plate or the glass components can also be used in the electronic devices or the display devices such as mobile phones, watches, computers and the touch screen displays, and the like.

Examples

The following non-limiting examples are provided to further clearly illustrate and explain the technical solutions of the present invention. The examples provided in the present invention are made in many efforts to ensure the accuracy of the values (e.g. the quantity, the temperature, etc.), however, the errors and the deviations must be taken into consideration. The composition itself is provided in wt % based on an oxide and has been normalized to 100%.

The examples for the glass composition are shown in Tables 1-3 below.

TABLE 1

| Components (wt %) | 1 | 2 | 3 | 4 | 5 | 6 | 7 | 8 |
|---|---|---|---|---|---|---|---|---|
| $SiO_2$ | 75.5 | 75.5 | 75.3 | 74.6 | 74.2 | 79.0 | 78.5 | 76.5 |
| $Al_2O_3$ | 8.5 | 7.6 | 8.5 | 9.5 | 9.8 | 7.0 | 8.0 | 8.0 |
| $Li_2O$ | 9.5 | 9.6 | 10.0 | 9.5 | 9.3 | 9.0 | 8.0 | 10.0 |
| $K_2O$ | 1.0 | 1.0 | 0.5 | 1.0 | 1.0 | 0.8 | 1.0 | 0.6 |
| ZnO | 0.7 | 0.5 | 0.5 | 1.0 | 0.6 | 0.0 | 0.4 | 0.5 |
| MgO | 1.0 | 1.0 | 1.0 | 0.9 | 1.0 | 1.0 | 1.0 | 1.0 |
| $P_2O_5$ | 1.8 | 1.9 | 2.0 | 1.5 | 1.7 | 1.2 | 1.1 | 1.4 |
| $ZrO_2$ | 2.0 | 2.4 | 2.2 | 2.0 | 2.0 | 2.0 | 2.0 | 2.0 |
| $Sb_2O_3$ | 0.0 | 0.5 | 0.0 | 0.0 | 0.3 | 0.0 | 0.0 | 0.0 |
| SiO | 0.0 | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 | 0.0 |
| $Na_2O$ | 0.0 | 0.0 | 0.0 | 0.0 | 0.1 | 0.0 | 0.0 | 0.0 |
| $B_2O_3$ | 0.0 | 0.0 | 0.0 | 0.0 | 0.0 | 0.0 | 0.0 | 0.0 |

TABLE 1-continued

| Components (wt %) | 1 | 2 | 3 | 4 | 5 | 6 | 7 | 8 |
|---|---|---|---|---|---|---|---|---|
| $Y_2O_3$ | 0.0 | 0.0 | 0.0 | 0.0 | 0.0 | 0.0 | 0.0 | 0.0 |
| $(SiO_2 + Li_2O)/Al_2O_3$ | 10.00 | 11.20 | 10.04 | 8.85 | 8.52 | 12.57 | 10.81 | 10.81 |
| $(SiO_2 + Li_2O)/P_2O_5$ | 47.22 | 44.79 | 42.65 | 56.07 | 49.12 | 73.33 | 78.64 | 61.79 |
| $(Al_2O_3 + Li_2O)/P_2O_5$ | 10.00 | 9.05 | 9.25 | 12.67 | 11.24 | 13.33 | 14.55 | 12.86 |
| $(SiO_2 + Al_2O_3 + Li_2O + ZrO_2)/P_2O_5$ | 53.06 | 50.05 | 48.00 | 63.73 | 56.06 | 80.83 | 87.73 | 68.93 |
| $(MgO + K_2O)/ZrO_2$ | 1.00 | 0.83 | 0.68 | 0.95 | 1.00 | 0.90 | 1.00 | 0.80 |
| $Li_2O/(K_2O + ZrO_2)$ | 3.17 | 2.82 | 3.70 | 3.17 | 3.10 | 3.21 | 2.67 | 3.85 |
| Thermal Expansion Coefficient ($\alpha_{20°C.-120°C.}$)($\times 10^{-7}$/K) | 64 | 62 | 58 | 65 | 64 | 57 | 55 | 59 |
| Refractive Index (nd) | 1.5215 | 1.5206 | 1.5159 | 1.5233 | 1.5219 | 1.5189 | 1.5142 | 1.5177 |

TABLE 2

| Components (wt %) | 9 | 10 | 11 | 12 | 13 | 14 | 15 | 16 |
|---|---|---|---|---|---|---|---|---|
| $SiO_2$ | 72.0 | 71.9 | 73.0 | 73.5 | 76.0 | 74.0 | 74.5 | 74.5 |
| $Al_2O_3$ | 9.5 | 9.0 | 8.0 | 7.8 | 6.9 | 7.9 | 7.8 | 9.5 |
| $Li_2O$ | 10.0 | 10.0 | 9.9 | 10.0 | 9.6 | 10.0 | 9.7 | 9.0 |
| $K_2O$ | 0.5 | 1.0 | 1.0 | 1.0 | 1.0 | 0.6 | 1.1 | 0.9 |
| ZnO | 1.0 | 2.5 | 2.3 | 2.3 | 0.8 | 1.2 | 1.3 | 0.9 |
| MgO | 2.0 | 1.0 | 1.5 | 1.0 | 1.0 | 1.5 | 1.0 | 1.0 |
| $P_2O_5$ | 1.8 | 1.9 | 1.8 | 1.9 | 2.0 | 2.0 | 1.9 | 1.8 |
| $ZrO_2$ | 3.0 | 2.2 | 2.5 | 2.2 | 2.2 | 2.5 | 2.2 | 2.2 |
| $Sb_2O_3$ | 0.2 | 0.0 | 0.0 | 0.3 | 0.5 | 0.3 | 0.3 | 0.2 |
| SrO | 0.0 | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 | 0.0 |
| $Y_2O_3$ | 0.0 | 0.0 | 0.0 | 0.0 | 0.0 | 0.0 | 0.0 | 0.0 |
| $Na_2O$ | 0.0 | 0.5 | 0.0 | 0.0 | 0.0 | 0.0 | 0.0 | 0.0 |
| $B_2O_3$ | 0.0 | 0.0 | 0.0 | 0.0 | 0.0 | 0.0 | 0.2 | 0.0 |
| $(SiO_2 + Li_2O)/Al_2O_3$ | 8.63 | 9.10 | 10.36 | 10.71 | 12.41 | 10.63 | 10.79 | 8.79 |
| $(SiO_2 + Li_2O)/P_2O_5$ | 45.56 | 43.11 | 46.06 | 43.95 | 42.80 | 42.00 | 44.32 | 46.39 |
| $(Al_2O_3 + Li_2O)/P_2O_5$ | 10.83 | 10.00 | 9.94 | 9.37 | 8.25 | 8.95 | 9.21 | 10.28 |
| $(SiO_2 + Al_2O_3 + Li_2O + ZrO_2)/P_2O_5$ | 52.50 | 49.00 | 51.89 | 49.21 | 47.35 | 47.20 | 49.58 | 52.89 |
| $(MgO + K_2O)/ZrO_2$ | 0.83 | 0.91 | 1.00 | 0.91 | 0.91 | 0.84 | 0.95 | 0.86 |
| $Li_2O/(K_2O + ZrO_2)$ | 2.86 | 3.13 | 2.83 | 3.13 | 3.00 | 3.23 | 2.94 | 2.90 |
| Thermal Expansion Coefficient ($\alpha_{20°C.-120°C.}$)($\times 10^{-7}$/K) | 63 | 63 | 64 | 61 | 57 | 59 | 59 | 63 |
| Refractive Index (nd) | 1.5243 | 1.522 | 1.5239 | 1.5211 | 1.5135 | 1.5146 | 1.5232 | 1.524 |

TABLE 3

| Components (wt %) | 17 | 18 | 19 | 20 | 21 | 22 | 23 |
|---|---|---|---|---|---|---|---|
| $SiO_2$ | 74.9 | 72.5 | 72.7 | 75.9 | 75.8 | 75.7 | 75.5 |
| $Al_2O_3$ | 8.5 | 7.5 | 9.5 | 7.0 | 7.3 | 7.5 | 7.8 |
| $Li_2O$ | 10.0 | 12.0 | 9.5 | 9.9 | 9.8 | 9.7 | 9.6 |
| $K_2O$ | 1.0 | 1.5 | 1.0 | 1.0 | 1.0 | 1.0 | 1.0 |
| ZnO | 0.2 | 1.7 | 1.9 | 0.9 | 0.8 | 0.8 | 0.8 |
| MgO | 1.0 | 0.5 | 1.0 | 1.0 | 1.0 | 1.0 | 1.0 |
| $P_2O_5$ | 2.0 | 1.9 | 1.9 | 1.9 | 1.9 | 1.9 | 1.9 |
| $ZrO_2$ | 2.2 | 2.2 | 2.0 | 2.2 | 2.2 | 2.2 | 2.2 |
| $Sb_2O_3$ | 0.2 | 0.2 | 0.5 | 0.2 | 0.2 | 0.2 | 0.2 |
| SrO | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 |
| $Y_2O_3$ | 0.0 | 0.0 | 0.0 | 0.0 | 0.0 | 0.0 | 0.0 |
| $Na_2O$ | 0.0 | 0.0 | 0.0 | 0.0 | 0.0 | 0.0 | 0.0 |

TABLE 3-continued

| Components (wt %) | 17 | 18 | 19 | 20 | 21 | 22 | 23 |
|---|---|---|---|---|---|---|---|
| $B_2O_3$ | 0.0 | 0.0 | 0.0 | 0.0 | 0.0 | 0.0 | 0.0 |
| $(SiO_2 + Li_2O)/Al_2O_3$ | 9.99 | 11.27 | 8.65 | 12.26 | 11.73 | 11.39 | 10.91 |
| $(SiO_2 + Li_2O)/P_2O_5$ | 42.45 | 44.47 | 43.26 | 45.16 | 45.05 | 44.95 | 44.79 |
| $(Al_2O_3 + Li_2O)/P_2O_5$ | 9.25 | 10.26 | 10.00 | 8.89 | 9.00 | 9.05 | 9.16 |
| $(SiO_2 + Al_2O_3 + Li_2O + ZrO_2)/P_2O_5$ | 47.80 | 49.58 | 49.32 | 50.00 | 50.05 | 50.05 | 50.05 |
| $(MgO + K_2O)/ZrO_2$ | 0.91 | 0.91 | 1.00 | 0.91 | 0.91 | 0.91 | 0.91 |
| $Li_2O/(K_2O + ZrO_2)$ | 3.13 | 3.24 | 3.17 | 3.09 | 3.06 | 3.03 | 3.00 |
| Thermal Expansion Coefficient $(\alpha_{20°C.-120°C.})(\times 10^{-7}/K)$ | 63 | 62 | 63 | 61 | 64 | 61 | 60 |
| Refractive Index (nd) | 1.5192 | 1.5224 | 1.5233 | 1.5226 | 1.5244 | 1.5213 | 1.5214 |

The examples for the glass-ceramic are shown in Tables 4-6 below.

TABLE 4

| Components (wt %) | 1 | 2 | 3 | 4 | 5 | 6 | 7 | 8 |
|---|---|---|---|---|---|---|---|---|
| $SiO_2$ | 75.5 | 75.5 | 75.3 | 74.6 | 74.2 | 79.0 | 78.5 | 76.5 |
| $Al_2O_3$ | 8.5 | 7.6 | 8.5 | 9.5 | 9.8 | 7.0 | 8.0 | 8.0 |
| $Li_2O$ | 9.5 | 9.6 | 10.0 | 9.5 | 9.3 | 9.0 | 8.0 | 10.0 |
| $K_2O$ | 1.0 | 1.0 | 0.5 | 1.0 | 1.0 | 0.8 | 1.0 | 0.6 |
| ZnO | 0.7 | 0.5 | 0.5 | 1.0 | 0.6 | 0.0 | 0.4 | 0.5 |
| MgO | 1.0 | 1.0 | 1.0 | 0.9 | 1.0 | 1.0 | 1.0 | 1.0 |
| $P_2O_5$ | 1.8 | 1.9 | 2.0 | 1.5 | 1.7 | 1.2 | 1.1 | 1.4 |
| $ZrO_2$ | 2.0 | 2.4 | 2.2 | 2.0 | 2.0 | 2.0 | 2.0 | 2.0 |
| $Sb_2O_3$ | 0.0 | 0.5 | 0.0 | 0.0 | 0.3 | 0.0 | 0.0 | 0.0 |
| SrO | 0.0 | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 | 0.0 |
| $Y_2O_3$ | 0.0 | 0.0 | 0.0 | 0.0 | 0.0 | 0.0 | 0.0 | 0.0 |
| $Na_2O$ | 0.0 | 0.0 | 0.0 | 0.0 | 0.1 | 0.0 | 0.0 | 0.0 |
| $B_2O_3$ | 0.0 | 0.0 | 0.0 | 0.0 | 0.0 | 0.0 | 0.0 | 0.0 |
| $(SiO_2 + Li_2O)/Al_2O_3$ | 10.00 | 11.20 | 10.04 | 8.85 | 8.52 | 12.57 | 10.81 | 10.81 |
| $(SiO_2 + Li_2O)/P_2O_5$ | 47.22 | 44.79 | 42.65 | 56.07 | 49.12 | 73.33 | 78.64 | 61.79 |
| $(Al_2O_3 + Li_2O)/P_2O_5$ | 10.00 | 9.05 | 9.25 | 12.67 | 11.24 | 13.33 | 14.55 | 12.86 |
| $(SiO_2 + Al_2O_3 + Li_2O + ZrO_2)/P_2O_5$ | 53.06 | 50.05 | 48.00 | 63.73 | 56.06 | 80.83 | 87.73 | 68.93 |
| $(MgO + K_2O)/ZrO_2$ | 1.00 | 0.83 | 0.68 | 0.95 | 1.00 | 0.90 | 1.00 | 0.80 |
| $Li_2O/(K_2O + ZrO_2)$ | 3.17 | 2.82 | 3.70 | 3.17 | 3.10 | 3.21 | 2.67 | 3.85 |
| Haze for Thickness of 0.55 mm (%) | 0.25 | 0.34 | 0.44 | 0.20 | 0.35 | 0.39 | 0.40 | 0.42 |
| Grain Size (nm) | 40 | 40 | 45 | 40 | 40 | 50 | 45 | 45 |
| Thermal Refractive Index Coefficient ($\times 10^{-6}/°C.$) | −1.4 | −1.5 | −0.8 | −1.4 | −1.4 | −1.1 | −0.9 | −0.8 |
| Crystallinity | 0.81 | 0.82 | 0.7 | 0.8 | 0.82 | 0.77 | 0.75 | 0.74 |
| Refractive Index (nd) | 1.5415 | 1.5406 | 1.5359 | 1.5433 | 1.5419 | 1.5389 | 1.5342 | 1.5377 |
| Average Light Transmittance for Thickness of 1 mm at 400-800 nm | 0.87 | 0.86 | 0.85 | 0.88 | 0.88 | 0.85 | 0.85 | 0.85 |
| Light Transmittance for Thickness of 0.55 mm at Wavelength of 550 nm | 0.92 | 0.91 | 0.88 | 0.92 | 0.92 | 0.88 | 0.9 | 0.89 |

TABLE 4-continued

| Components (wt %) | 1 | 2 | 3 | 4 | 5 | 6 | 7 | 8 |
|---|---|---|---|---|---|---|---|---|
| Predominant Crystalline Phase | quartz crystalline phase and lithium disilicate | quartz crystalline phase and lithium disilicate | quartz crystalline phase and lithium disilicate | quartz crystalline phase and lithium disilicate | quartz crystalline phase, lithium disilicate and petalite | quartz crystalline phase and lithium disilicate | quartz crystalline phase and lithium disilicate | quartz crystalline phase and lithium disilicate |
| First Temperature and Time for Crystallization | 540° C.-10 h | 560° C.-10 h | 570° C.-10 h | 590° C.-10 h | 580° C.-6 h | 590° C.-10 h | 600° C.-10 h | 590° C.-10 h |
| Second Temperature and Time for Crystallization | 770° C.-0.5 h | 740° C.-4 h | 800° C.-0.5 h | 715° C.-1 h | 690° C.-2 h | 710° C.-6 h | 730° C.-2 h | 730° C.-1 h |

TABLE 5

| Components (wt %) | 9 | 10 | 11 | 12 | 13 | 14 | 15 | 16 |
|---|---|---|---|---|---|---|---|---|
| $SiO_2$ | 72.0 | 71.9 | 73.0 | 73.5 | 76.0 | 74.0 | 74.5 | 74.5 |
| $Al_2O_3$ | 9.5 | 9.0 | 8.0 | 7.8 | 6.9 | 7.9 | 7.8 | 9.5 |
| $Li_2O$ | 10.0 | 10.0 | 9.9 | 10.0 | 9.6 | 10.0 | 9.7 | 9.0 |
| $K_2O$ | 0.5 | 1.0 | 1.0 | 1.0 | 1.0 | 0.6 | 1.1 | 0.9 |
| ZnO | 1.0 | 2.5 | 2.3 | 2.5 | 0.8 | 1.2 | 1.3 | 0.9 |
| MgO | 2.0 | 1.0 | 1.5 | 1.0 | 1.0 | 1.5 | 1.0 | 1.0 |
| $P_2O_5$ | 1.8 | 1.9 | 1.8 | 1.9 | 2.0 | 2.0 | 1.9 | 1.8 |
| $ZrO_2$ | 3.0 | 2.2 | 2.5 | 2.2 | 2.2 | 2.5 | 2.2 | 2.2 |
| $Sb_2O_3$ | 0.2 | 0.0 | 0.0 | 0.3 | 0.5 | 0.3 | 0.3 | 0.2 |
| SrO | 0.0 | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 | 0.0 |
| $Y_2O_3$ | 0.0 | 0.0 | 0.0 | 0.0 | 0.0 | 0.0 | 0.0 | 0.0 |
| $Na_2O$ | 0.0 | 0.5 | 0.0 | 0.0 | 0.0 | 0.0 | 0.0 | 0.0 |
| $B_2O_3$ | 0.0 | 0.0 | 0.0 | 0.0 | 0.0 | 0.0 | 0.2 | 0.0 |
| $(SiO_2 + Li_2O)/Al_2O_3$ | 8.63 | 9.10 | 10.36 | 10.71 | 12.41 | 10.63 | 10.79 | 8.79 |
| $(SiO_2 + Li_2O)/P_2O_5$ | 45.56 | 43.11 | 46.06 | 43.95 | 42.80 | 42.00 | 44.32 | 46.39 |
| $(Al_2O_3 + Li_2O)/P_2O_5$ | 10.83 | 10.00 | 9.94 | 9.37 | 8.25 | 8.95 | 9.21 | 10.28 |
| $(SiO_2 + Al_2O_3 + Li_2O + ZrO_2)/P_2O_5$ | 52.50 | 49.00 | 51.89 | 49.21 | 47.35 | 47.20 | 49.58 | 52.89 |
| $(MgO + K_2O)/ZrO_2$ | 0.83 | 0.91 | 1.00 | 0.91 | 0.91 | 0.84 | 0.95 | 0.86 |
| $Li_2O/(K_2O + ZrO_2)$ | 2.86 | 3.13 | 2.83 | 3.13 | 3.00 | 3.23 | 2.94 | 2.90 |
| Haze for Thickness of 0.55 mm (%) | 0.35 | 0.36 | 0.24 | 0.35 | 0.38 | 0.38 | 0.39 | 0.26 |
| Grain Size (nm) | 40 | 40 | 40 | 40 | 50 | 45 | 45 | 40 |
| Thermal Refractive Index Coefficient ($\times 10^{-6}$/° C.) | −1.4 | −1.3 | −1.4 | −1.2 | −1.1 | −1.5 | −1.4 | −1.3 |
| Crystallinity | 0.83 | 0.8 | 0.83 | 0.81 | 0.78 | 0.82 | 0.81 | 0.83 |
| Refractive Index (nd) | 1.5443 | 1.542 | 1.5439 | 1.5411 | 1.5335 | 1.5346 | 1.5432 | 1.544 |
| Average Light Transmittance for Thickness of 1 mm at 400-800 nm | 0.87 | 0.87 | 0.88 | 0.87 | 0.85 | 0.85 | 0.85 | 0.88 |
| Light Transmittance for Thickness of 0.55 mm at Wavelength of 550 nm | 0.92 | 0.9 | 0.92 | 0.9 | 0.89 | 0.9 | 0.89 | 0.92 |
| Predominant Crystalline Phase | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate |
| First Temperature and Time for Crystallization | 510° C.-6 h | 510° C.-4 h | 510° C.-4 h | 550° C.-10 h | 520° C.-8 h | 520° C.-6 h | 520° C.-6 h | 510° C.-4 h |
| Second Temperature and Time for Crystallization | 710° C.-6 h | 715° C.-4 h | 740° C.-0.5 h | 710° C.-6 h | 715° C.-4 h | 720° C.-2 h | 720° C.-1 h | 715° C.-4 h |

TABLE 6

| Components (wt %) | 17 | 18 | 19 | 20 | 21 | 22 | 23 |
|---|---|---|---|---|---|---|---|
| $SiO_2$ | 74.9 | 72.5 | 72.7 | 75.9 | 75.8 | 75.7 | 75.5 |
| $Al_2O_3$ | 8.5 | 7.5 | 9.5 | 7.0 | 7.3 | 7.5 | 7.8 |
| $Li_2O$ | 10.0 | 12.0 | 9.5 | 9.9 | 9.8 | 9.7 | 9.6 |
| $K_2O$ | 1.0 | 1.5 | 1.0 | 1.0 | 1.0 | 1.0 | 1.0 |
| ZnO | 0.2 | 1.7 | 1.9 | 0.9 | 0.8 | 0.8 | 0.8 |
| MgO | 1.0 | 0.5 | 1.0 | 1.0 | 1.0 | 1.0 | 1.0 |
| $P_2O_5$ | 2.0 | 1.9 | 1.9 | 1.9 | 1.9 | 1.9 | 1.9 |
| $ZrO_2$ | 2.2 | 2.2 | 2.0 | 2.2 | 2.2 | 2.2 | 2.2 |
| $Sb_2O_3$ | 0.2 | 0.2 | 0.5 | 0.2 | 0.2 | 0.2 | 0.2 |
| SrO | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 |
| $Y_2O_3$ | 0.0 | 0.0 | 0.0 | 0.0 | 0.0 | 0.0 | 0.0 |
| $Na_2O$ | 0.0 | 0.0 | 0.0 | 0.0 | 0.0 | 0.0 | 0.0 |
| $B_2O_3$ | 0.0 | 0.0 | 0.0 | 0.0 | 0.0 | 0.0 | 0.0 |
| $(SiO_2 + Li_2O)/Al_2O_3$ | 9.99 | 11.27 | 8.65 | 12.26 | 11.73 | 11.39 | 10.91 |
| $(SiO_2 + Li_2O)/P_2O_5$ | 42.45 | 44.47 | 43.26 | 45.16 | 45.05 | 44.95 | 44.79 |
| $(Al_2O_3 + Li_2O)/P_2O_5$ | 9.25 | 10.26 | 10.00 | 8.89 | 9.00 | 9.05 | 9.16 |
| $(SiO_2 + Al_2O_3 + Li_2O + ZrO_2)/P_2O_5$ | 47.80 | 49.58 | 49.32 | 50.00 | 50.05 | 50.05 | 50.05 |
| $(MgO + K_2O)/ZrO_2$ | 0.91 | 0.91 | 1.00 | 0.91 | 0.91 | 0.91 | 0.91 |
| $Li_2O/(K_2O + ZrO_2)$ | 3.13 | 3.24 | 3.17 | 3.09 | 3.06 | 3.03 | 3.00 |
| Haze for Thickness of 0.55 mm (%) | 0.36 | 0.37 | 0.38 | 0.37 | 0.23 | 0.38 | 0.36 |
| Grain Size (nm) | 50 | 45 | 45 | 45 | 40 | 50 | 50 |
| Thermal Refractive Index Coefficient ($\times 10^{-6}/°C$) | −1.4 | −1.2 | −1.4 | −1.5 | −1.4 | −1.3 | −1.4 |
| Crystallinity | 0.8 | 0.82 | 0.81 | 0.82 | 0.84 | 0.82 | 0.83 |
| Refractive Index (nd) | 1.5392 | 1.5424 | 1.5433 | 1.5426 | 1.5444 | 1.5413 | 1.5414 |
| Average Light Transmittance for Thickness of 1 mm at 400-800 nm | 0.85 | 0.85 | 0.85 | 0.85 | 0.9 | 0.85 | 0.85 |
| Light Transmittance for Thickness of 0.55 mm at Wavelength of 550 nm | 0.9 | 0.91 | 0.91 | 0.9 | 0.92 | 0.9 | 0.9 |
| Predominant Crystalline Phase | quartz crystalline phase, lithium disilicate and petalite | quartz crystalline phase and lithium disilicate | quartz crystalline phase and lithium disilicate | quartz crystalline phase and lithium di silicate | quartz crystalline phase and lithium disilicate | quartz crystalline phase and lithium disilicate | quartz crystalline phase and lithium disilicate |
| First Temperature and Time for Crystallization | 510° C.-6 h | 520° C.-6 h | 560° C.-6 h | 520° C.-2 h | 510° C.-6 h | 520° C.-4 h | 510° C.-6 h |
| Second Temperature and Time for Crystallization | 690° C.-2 h | 710° C.-6 h | 715° C.-4 h | 720° C.-2 h | 710° C.-6 h | 715° C.-4 h | 720° C.-2 h |

The examples for the glass-ceramic article are shown in Tables 7-9 below.

TABLE 7

| Components (wt %) | 1 | 2 | 3 | 4 | 5 | 6 | 7 | 8 |
|---|---|---|---|---|---|---|---|---|
| $SiO_2$ | 75.5 | 75.5 | 75.3 | 74.6 | 74.2 | 79.0 | 78.5 | 76.5 |
| $Al_2O_3$ | 8.5 | 7.6 | 8.5 | 9.5 | 9.8 | 7.0 | 8.0 | 8.0 |
| $Li_2O$ | 9.5 | 9.6 | 10.0 | 9.5 | 9.3 | 9.0 | 8.0 | 10.0 |
| $K_2O$ | 1.0 | 1.0 | 0.5 | 1.0 | 1.0 | 0.8 | 1.0 | 0.6 |
| ZnO | 0.7 | 0.5 | 0.5 | 1.0 | 0.6 | 0.0 | 0.4 | 0.5 |
| MgO | 1.0 | 1.0 | 1.0 | 0.9 | 1.0 | 1.0 | 1.0 | 1.0 |
| $P_2O_5$ | 1.8 | 1.9 | 2.0 | 1.5 | 1.7 | 1.2 | 1.1 | 1.4 |
| $ZrO_2$ | 2.0 | 2.4 | 2.2 | 2.0 | 2.0 | 2.0 | 2.0 | 2.0 |
| $Sb_2O_3$ | 0.0 | 0.5 | 0.0 | 0.0 | 0.3 | 0.0 | 0.0 | 0.0 |
| SrO | 0.0 | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 | 0.0 |

TABLE 7-continued

| Components (wt %) | 1 | 2 | 3 | 4 | 5 | 6 | 7 | 8 |
|---|---|---|---|---|---|---|---|---|
| $Y_2O_3$ | 0.0 | 0.0 | 0.0 | 0.0 | 0.0 | 0.0 | 0.0 | 0.0 |
| $Na_2O$ | 0.0 | 0.0 | 0.0 | 0.0 | 0.1 | 0.0 | 0.0 | 0.0 |
| $B_2O_3$ | 0.0 | 0.0 | 0.0 | 0.0 | 0.0 | 0.0 | 0.0 | 0.0 |
| $(SiO_2 + Li_2O)/Al_2O_3$ | 10.00 | 11.20 | 10.04 | 8.85 | 8.52 | 12.57 | 10.81 | 10.81 |
| $(SiO_2 + Li_2O)/P_2O_5$ | 47.22 | 44.79 | 42.65 | 56.07 | 49.12 | 73.33 | 78.64 | 61.79 |
| $(Al_2O_3 + Li_2O)/P_2O_5$ | 10.00 | 9.05 | 9.25 | 12.67 | 11.24 | 13.33 | 14.55 | 12.86 |
| $(SiO_2 + Al_2O_3 + Li_2O + ZrO_2)/P_2O_5$ | 53.06 | 50.05 | 48.00 | 63.73 | 56.06 | 80.83 | 87.73 | 68.93 |
| $(MgO + K_2O)/ZrO_2$ | 1.00 | 0.83 | 0.68 | 0.95 | 1.00 | 0.90 | 1.00 | 0.80 |
| $Li_2O/(K_2O + ZrO_2)$ | 3.17 | 2.82 | 3.70 | 3.17 | 3.10 | 3.21 | 2.67 | 3.85 |
| Haze for Thickness of 0.55 mm (%) | 0.25 | 0.34 | 0.44 | 0.20 | 0.35 | 0.39 | 0.4 | 0.42 |
| Grain Size (nm) | 40 | 40 | 45 | 40 | 40 | 50 | 45 | 45 |
| Thermal Refractive Index Coefficient ($\times 10^{-6}/°C$) | −1.4 | −1.5 | −0.8 | −1.4 | −1.4 | −1.1 | −0.9 | −0.8 |
| Crystallinity | 0.81 | 0.82 | 0.7 | 0.8 | 0.82 | 0.77 | 0.75 | 0.74 |
| Refractive Index (nd) | 1.5415 | 1.5406 | 1.5359 | 1.5433 | 1.5419 | 1.5389 | 1.5342 | 1.5377 |
| Average Light Transmittance for Thickness of 1 mm at 400-800 nm | 0.87 | 0.86 | 0.85 | 0.88 | 0.88 | 0.85 | 0.85 | 0.85 |
| Light Transmittance for Thickness of 0.55 mm at Wavelength of 550 nm | 0.92 | 0.91 | 0.88 | 0.92 | 0.92 | 0.88 | 0.9 | 0.89 |
| Predominant Crystalline Phase | quartz crystalline phase and lithium disilicate | quartz crystalline phase and lithium disilicate | quartz crystalline phase and lithium disilicate | quartz crystalline phase and lithium disilicate | quartz crystalline phase, lithium disilicate and petalite | quartz crystalline phase and lithium disilicate | quartz crystalline phase and lithium disilicate | quartz crystalline phase and lithium disilicate |
| Surface Stress (MPa) | 379 | 380 | 287 | 369 | 363 | 351 | 300 | 298 |
| Four-Point Bending Strength (MPa) | 750 | 752 | 685 | 739 | 742 | 701 | 698 | 677 |
| Depth of Ion Exchange Layer (μm) | 94 | 85 | 75 | 88 | 90 | 80 | 78 | 79 |
| Falling ball Height (mm) | 1450 | 1400 | 1150 | 1250 | 1400 | 1250 | 1200 | 1200 |
| Fracture Toughness ($MPa \cdot m^{1/2}$) | 2.1 | 2 | 1.3 | 1.7 | 1.6 | 1.5 | 1.2 | 1.3 |

TABLE 8

| Components (wt %) | 9 | 10 | 11 | 12 | 13 | 14 | 15 | 16 |
|---|---|---|---|---|---|---|---|---|
| $SiO_2$ | 72.0 | 71.9 | 73.0 | 73.5 | 76.0 | 74.0 | 74.5 | 74.5 |
| $Al_2O_3$ | 9.5 | 9.0 | 8.0 | 7.8 | 6.9 | 7.9 | 7.8 | 9.5 |
| $Li_2O$ | 10.0 | 10.0 | 9.9 | 10.0 | 9.6 | 10.0 | 9.7 | 9.0 |
| $K_2O$ | 0.5 | 1.0 | 1.0 | 1.0 | 1.0 | 0.6 | 1.1 | 0.9 |
| ZnO | 1.0 | 2.5 | 2.3 | 2.3 | 0.8 | 1.2 | 1.3 | 0.9 |
| MgO | 2.0 | 1.0 | 1.5 | 1.0 | 1.0 | 1.5 | 1.0 | 1.0 |
| $P_2O_5$ | 1.8 | 1.9 | 1.8 | 1.9 | 2.0 | 2.0 | 1.9 | 1.8 |
| $ZrO_2$ | 3.0 | 2.2 | 2.5 | 2.2 | 2.2 | 2.5 | 2.2 | 2.2 |
| $Sb_2O_3$ | 0.2 | 0.0 | 0.0 | 0.3 | 0.5 | 0.3 | 0.3 | 0.2 |
| SrO | 0.0 | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 | 0.0 |
| $Y_2O_3$ | 0.0 | 0.0 | 0.0 | 0.0 | 0.0 | 0.0 | 0.0 | 0.0 |
| $Na_2O$ | 0.0 | 0.5 | 0.0 | 0.0 | 0.0 | 0.0 | 0.0 | 0.0 |
| $B_2O_3$ | 0.0 | 0.0 | 0.0 | 0.0 | 0.0 | 0.0 | 0.2 | 0.0 |
| $(SiO_2 + Li_2O)/Al_2O_3$ | 8.63 | 9.10 | 10.36 | 10.71 | 12.41 | 10.63 | 10.79 | 8.79 |
| $(SiO_2 + Li_2O)/P_2O_5$ | 45.56 | 43.11 | 46.06 | 43.95 | 42.80 | 42.00 | 44.32 | 46.39 |
| $(Al_2O_3 + Li_2O)/P_2O_5$ | 10.83 | 10.00 | 9.94 | 9.37 | 8.25 | 8.95 | 9.21 | 10.28 |
| $(SiO_2 + Al_2O_3 + Li_2O + ZrO_2)/P_2O_5$ | 52.50 | 49.00 | 51.89 | 49.21 | 47.35 | 47.20 | 49.58 | 52.89 |

TABLE 8-continued

| Components (wt %) | 9 | 10 | 11 | 12 | 13 | 14 | 15 | 16 |
|---|---|---|---|---|---|---|---|---|
| $(MgO + K_2O)/ZrO_2$ | 0.83 | 0.91 | 1.00 | 0.91 | 0.91 | 0.84 | 0.95 | 0.86 |
| $Li_2O/(K_2O + ZrO_2)$ | 2.86 | 3.13 | 2.83 | 3.13 | 3.00 | 3.23 | 2.94 | 2.90 |
| Haze for Thickness of 0.55 mm (%) | 0.35 | 0.36 | 0.24 | 0.35 | 0.38 | 0.38 | 0.39 | 0.26 |
| Grain Size (nm) | 40 | 40 | 40 | 40 | 50 | 45 | 45 | 40 |
| Thermal Refractive Index Coefficient ($\times 10^{-6}/°$ C.) | −1.4 | −1.3 | −1.4 | −1.2 | −1.1 | −1.5 | −1.4 | −1.3 |
| Crystallinity | 0.83 | 0.8 | 0.83 | 0.81 | 0.78 | 0.82 | 0.81 | 0.83 |
| Refractive Index (nd) | 1.5443 | 1.542 | 1.5439 | 1.5411 | 1.5335 | 1.5346 | 1.5432 | 1.544 |
| Average Light Transmittance for Thickness of 1 mm at 400-800 nm | 0.87 | 0.87 | 0.88 | 0.87 | 0.85 | 0.85 | 0.85 | 0.88 |
| Light Transmittance for Thickness of 0.55 mm at Wavelength of 550 nm | 0.92 | 0.9 | 0.92 | 0.9 | 0.89 | 0.9 | 0.89 | 0.92 |
| Predominant Crystalline Phase | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate |
| Surface Stress (MPa) | 378 | 372 | 374 | 355 | 358 | 360 | 359 | 375 |
| Four-Point Bending Strength (MPa) | 745 | 742 | 746 | 725 | 726 | 728 | 730 | 735 |
| Depth of Ion Exchange Layer (μm) | 85 | 86 | 92 | 92 | 85 | 81 | 82 | 93 |
| Falling-ball Height (mm) | 1300 | 1300 | 1350 | 1350 | 1300 | 1350 | 1500 | 1550 |
| Fracture Toughness ($MPa \cdot m^{1/2}$) | 2 | 2.1 | 2 | 1.9 | 1.7 | 1.9 | 1.8 | 1.6 |

TABLE 9

| Components (wt %) | 17 | 18 | 19 | 20 | 21 | 22 | 23 |
|---|---|---|---|---|---|---|---|
| $SiO_2$ | 74.9 | 72.5 | 72.7 | 75.9 | 75.8 | 75.7 | 75.5 |
| $Al_2O_3$ | 8.5 | 7.5 | 9.5 | 7.0 | 7.3 | 7.5 | 7.8 |
| $Li_2O$ | 10.0 | 12.0 | 9.5 | 9.9 | 9.8 | 9.7 | 9.6 |
| $K_2O$ | 1.0 | 1.5 | 1.0 | 1.0 | 1.0 | 1.0 | 1.0 |
| ZnO | 0.2 | 1.7 | 1.9 | 0.9 | 0.8 | 0.8 | 0.8 |
| MgO | 1.0 | 0.5 | 1.0 | 1.0 | 1.0 | 1.0 | 1.0 |
| $P_2O_5$ | 2.0 | 1.9 | 1.9 | 1.9 | 1.9 | 1.9 | 1.9 |
| $ZrO_2$ | 2.2 | 2.2 | 2.0 | 2.2 | 2.2 | 2.2 | 2.2 |
| $Sb_2O_3$ | 0.2 | 0.2 | 0.5 | 0.2 | 0.2 | 0.2 | 0.2 |
| SrO | 0.0 | 0.0 | 0.0 | 0.0 | 0.0 | 0.0 | 0.0 |
| BaO | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 |
| $Y_2O_3$ | 0.0 | 0.0 | 0.0 | 0.0 | 0.0 | 0.0 | 0.0 |
| $Na_2O$ | 0.0 | 0.0 | 0.0 | 0.0 | 0.0 | 0.0 | 0.0 |
| $B_2O_3$ | 0.0 | 0.0 | 0.0 | 0.0 | 0.0 | 0.0 | 0.0 |
| $(SiO_2 + Li_2O)/Al_2O_3$ | 9.99 | 11.27 | 8.65 | 12.26 | 11.73 | 11.39 | 10.91 |
| $(SiO_2 + Li_2O)/P_2O_5$ | 42.45 | 44.47 | 43.26 | 45.16 | 45.05 | 44.95 | 44.79 |
| $(Al_2O_3 + Li_2O)/P_2O_5$ | 9.25 | 10.26 | 10.00 | 8.89 | 9.00 | 9.05 | 9.16 |
| $(SiO_2 + Al_2O_3 + Li_2O + ZrO_2)/P_2O_5$ | 47.80 | 49.58 | 49.32 | 50.00 | 50.05 | 50.05 | 50.05 |
| $(MgO + K_2O)/ZrO_2$ | 0.91 | 0.91 | 1.00 | 0.91 | 0.91 | 0.91 | 0.91 |
| $Li_2O/(K_2O + ZrO_2)$ | 3.13 | 3.24 | 3.17 | 3.09 | 3.06 | 3.03 | 3.00 |
| Haze for Thickness of 0.55 mm (%) | 0.36 | 0.37 | 0.38 | 0.37 | 0.23 | 0.38 | 0.36 |

TABLE 9-continued

| Components (wt %) | 17 | 18 | 19 | 20 | 21 | 22 | 23 |
|---|---|---|---|---|---|---|---|
| Grain Size (nm) | 50 | 45 | 45 | 45 | 40 | 50 | 50 |
| Thermal Refractive Index Coefficient ($\times 10^{-6}/°$ C.) | −1.4 | −1.2 | −1.4 | −1.5 | −1.4 | −1.3 | −1.4 |
| Crystallinity | 0.8 | 0.82 | 0.81 | 0.82 | 0.84 | 0.82 | 0.83 |
| Refractive Index (nd) | 1.5392 | 1.5424 | 1.5433 | 1.5426 | 1.5444 | 1.5413 | 1.5414 |
| Average Light Transmittance for Thickness of 1 mm at 400-800 nm | 0.85 | 0.85 | 0.85 | 0.85 | 0.89 | 0.85 | 0.85 |
| Light Transmittance for Thickness of 0.55 mm at Wavelength of 550 nm | 0.9 | 0.91 | 0.91 | 0.9 | 0.92 | 0.9 | 0.9 |
| Predominant Crystalline Phase | quartz crystalline phase, lithium disilicate and petalite | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate | quartz crystalline phase and lithium disilicate |
| Surface Stress (MPa) | 355 | 370 | 373 | 363 | 364 | 368 | 367 |
| Four-Point Bending Strength (MPa) | 731 | 739 | 738 | 728 | 724 | 721 | 720 |
| Depth of Ion Exchange Layer (μm) | 89 | 89 | 89 | 89 | 95 | 88 | 86 |
| Falling ball Height (mm) | 1300 | 1200 | 1500 | 1300 | 1500 | 1450 | 1500 |
| Fracture Toughness (MPa·m$^{1/2}$) | 1.9 | 2.1 | 1.8 | 1.9 | 1.6 | 1.7 | 1.6 |

What is claimed is:

1. A glass-ceramic article for an electronic device cover plate, comprising, as a predominant crystalline phase, lithium silicate and a quartz crystalline phase, and having a composition comprising in weight percent following components:
$SiO_2$: 65-85%, $Al_2O_3$: 1-15%, $Li_2O$: 5-15%, $ZrO_2$: 0.1-10%, $P_2O_5$: 0.79-2.5%, $K_2O$: 0-10%, MgO: 0.3-10%, ZnO: 0-10%, free of $Na_2O$, and free of $B_2O_3$,
wherein $(SiO_2+Al_2O_3+Li_2O+ZrO_2)/P_2O_5$ is 40-90, $(Al_2O_3+Li_2O)/P_2O_5$ is 8.5-20, and $2.67 < Li_2O/(K_2O+ZrO_2) \leq 4.0$, and
a falling ball test height is 700 mm or more, indicating when a steel ball of 132 g is dropped from the falling ball test height, a sample of the glass-ceramic article of 150×57×0.55 mm is not broken into pieces.

2. The glass-ceramic article for the electronic device cover plate according to claim 1, further comprising in weight percent following components: SrO: 0-5%, BaO: 0-5%, $TiO_2$: 0-5%, $Y_2O_3$: 0-5%, and a fining agent: 0-2%.

3. The glass-ceramic article for the electronic device cover plate according to claim 1, wherein $(SiO_2+Li_2O)/Al_2O_3$ is 6-15, $(SiO_2+Li_2O)/P_2O_5$ is 40-80, $(K_2O+MgO)/ZrO_2$ is 0.6-1.2, or $Li_2O/(K_2O+ZrO_2)$ is 2.8-4.0.

4. The glass-ceramic article for the electronic device cover plate according to claim 1, wherein $(SiO_2+Li_2O)/Al_2O_3$ is 8-13, $(SiO_2+Li_2O)/P_2O_5$ is 40-70, $(SiO_2+Al_2O_3+Li_2O+ZrO_2)/P_2O_5$ is 45-85, $(K_2O+MgO)/ZrO_2$ is 0.7-1.1, or $Li_2O/(K_2O+ZrO_2)$ is 2.8-3.5.

5. The glass-ceramic article for the electronic device cover plate according to claim 1, comprising in weight percent following components: $SiO_2$: 70-76%, $Al_2O_3$: 4-10%, $Li_2O$: 8-12.5%, $ZrO_2$: 1-5%, $P_2O_5$: 1-2.42%, $K_2O$: 0-3%, MgO: 0.3-2%, ZnO: 0-3%, $Sb_2O_3$: 0-1%, $SnO_2$: 0-1%, SnO: 0-1%, or $CeO_2$: 0-1%.

6. The glass-ceramic article for the electronic device cover plate according to claim 1, wherein $(Al_2O_3+Li_2O)/P_2O_5$ is 8.5-14; $(SiO_2+Li_2O)/P_2O_5$ is 45-60, $(SiO_2+Al_2O_3+Li_2O+ZrO_2)/P_2O_5$ is 48-80, or $(SiO_2+Li_2O)/Al_2O_3$ is 8.5-12.

7. The glass-ceramic article for the electronic device cover plate according to claim 1, wherein $(K_2O+MgO)/ZrO_2$ is 0.8-1.0, or $Li_2O/(K_2O+ZrO_2)$ is 2.8-3.3.

8. The glass-ceramic article for the electronic device cover plate according to claim 1, comprising in weight percent $Li_2O$ 8%-less than 10%, free of SrO, free of BaO, free of $TiO_2$, free of $Y_2O_3$, free of $GeO_2$, free of CaO, free of $Cs_2O$, free of PbO, free of $As_2O_3$, free of $La_2O_3$ and free of $Tb_2O_3$.

9. The glass-ceramic article for the electronic device cover plate according to claim 1, wherein a crystallinity is 70% or more.

10. The glass-ceramic article for the electronic device cover plate according to claim 1, wherein a falling ball test height is 1000 mm or more; or a four-point bending strength is 650 MPa or more; or a haze for a thickness of 0.55 mm is 0.5% or less; or a thermal refractive index coefficient is $-0.8 \times 10^{-6}/°$ C. or less; or a light transmittance for a thickness of 0.55 mm at a wavelength of 550 nm is 88% or more.

11. A glass-ceramic, comprising, as a predominant crystalline phase, lithium silicate and a quartz crystalline phase, and having a composition consisting of in weight percent following components:
$SiO_2$: 65-85%, $Al_2O_3$: 1-15%, $Li_2O$: 5-15%, $ZrO_2$: 0.1-10%, $P_2O_5$: 0.79-2.5%, $K_2O$: 0-10%, MgO: 0.3-10%, ZnO: 0-10%, $Sb_2O_3$: 0-1%, $SnO_2$: 0-1%, SnO: 0-1%, $CeO_2$: 0-1%, free of $Na_2O$ and free of $B_2O_3$,
wherein $(SiO_2+Al_2O_3+Li_2O+ZrO_2)/P_2O_5$ is 40-90, $(Al_2O_3+Li_2O)/P_2O_5$ is 8.5-20, $(K_2O+MgO)/ZrO_2$ is 0.6-1.2, and $2.67<Li_2O/(K_2O+ZrO_2)\leq 4.0$; and a haze for a thickness of 0.55 mm is 0.5% or less.

12. The glass-ceramic according to claim 11, wherein $(SiO_2+Al_2O_3+Li_2O+ZrO_2)/P_2O_5$ is 45-85; $(SiO_2+Li_2O)/Al_2O_3$ is 8-13; $(Al_2O_3+Li_2O)/P_2O_5$ is 8.5-14; $(SiO_2+Li_2O)/P_2O_5$ is 40-70; or $Li_2O/(K_2O+ZrO_2)$ is 2.8-3.5.

13. The glass-ceramic according to claim 11, wherein $SiO_2$: 70-76%, $Al_2O_3$: 4-10%, $Li_2O$: 8-12.5%, $ZrO_2$: 1-5%, $P_2O_5$: 1-2.42%, $K_2O$: 0-3%, MgO: 0.3-2%, and ZnO: 0-3%.

14. The glass-ceramic according to claim 11, wherein $(K_2O+MgO)/ZrO_2$ is 0.8-1.0, or $Li_2O/(K_2O+ZrO_2)$ is 2.8-3.3.

15. The glass-ceramic according to claim 11, wherein a crystallinity is 70% or more; or a grain size is 80 nm or less; or a thermal refractive index coefficient is $-0.8\times 10^{-6}/°$ C. or less; or an average light transmittance for a thickness of 1 mm at a wavelength of 400-800 nm is 85% or more.

16. A glass cover plate for an electronic device, comprising the glass-ceramic article for the electronic device cover plate claimed in claim 1.

17. A glass cover plate for an electronic device, comprising the glass-ceramic claimed in claim 11.

18. An electronic device, comprising the glass-ceramic article for the electronic device cover plate claimed in claim 1.

19. An electronic device, comprising the glass-ceramic claimed in claim 11.

20. An electronic device, comprising the glass cover plate for the electronic device claimed in claim 16.

21. The glass-ceramic article for the electronic device cover plate according to claim 1, wherein $43.35<(SiO_2+Li_2O)/P_2O_5\leq 80$.

22. The glass-ceramic according to claim 11, wherein $43.35<(SiO_2+Li_2O)/P_2O_5\leq 80$.

23. The glass-ceramic according to claim 11, wherein a grain size is 50 nm or less.

24. The glass-ceramic according to claim 11, wherein a grain size is 40 nm or less.

25. The glass-ceramic article for the electronic device cover plate according to claim 1, wherein MgO is 0.3-5%.

26. The glass-ceramic article for the electronic device cover plate according to claim 1, wherein $K_2O$ is 0.5-1.1%.

27. The glass-ceramic article for the electronic device cover plate according to claim 25, wherein $K_2O$ is 0.5-1.1%.

28. The glass-ceramic article for the electronic device cover plate according to claim 1, wherein $(SiO_2+Li_2O)/Al_2O_3$ is 6-15, $(SiO_2+Li_2O)/P_2O_5$ is 40-80, and $Li_2O/(K_2O+ZrO_2)$ is 2.8-4.0.

29. The glass-ceramic article for the electronic device cover plate according to claim 1, wherein $P_2O_5$ is 1-2.42%.

30. The glass-ceramic according to claim 11, wherein $P_2O_5$ is 1-2.42%.

* * * * *